United States Patent
Lee et al.

(10) Patent No.: US 12,068,023 B2
(45) Date of Patent: Aug. 20, 2024

(54) MEMORY CIRCUITS, MEMORY STRUCTURES, AND METHODS FOR FABRICATING A MEMORY DEVICE

(71) Applicant: Taiwan Semiconductor Manufacturing Company, Ltd., Hsinchu (TW)

(72) Inventors: Chieh Lee, Hsinchu (TW); Yi-Ching Liu, Hsinchu (TW); Chia-En Huang, Xinfeng Township, Hsinchu County (TW); Wen-Chang Cheng, Richmond, TX (US); Jonathan Tsung-Yung Chang, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 313 days.

(21) Appl. No.: 17/643,191

(22) Filed: Dec. 8, 2021

(65) Prior Publication Data
US 2022/0358993 A1    Nov. 10, 2022

Related U.S. Application Data

(60) Provisional application No. 63/185,314, filed on May 6, 2021.

(51) Int. Cl.
*G11C 8/00* (2006.01)
*G11C 11/4091* (2006.01)
*H10B 12/00* (2023.01)

(52) U.S. Cl.
CPC .......... *G11C 11/4091* (2013.01); *H10B 12/09* (2023.02); *H10B 12/50* (2023.02)

(58) Field of Classification Search
CPC ...... G11C 11/4091; H10B 12/50; H10B 12/09
USPC ........................................................ 365/230
See application file for complete search history.

(56) References Cited

U.S. PATENT DOCUMENTS

| | | | | |
|---|---|---|---|---|
| 7,440,329 B2* | 10/2008 | Ohsawa | ............. | H01L 29/7841 |
| | | | | 365/185.26 |
| 7,839,711 B2* | 11/2010 | Higashi | ................ | G11C 11/404 |
| | | | | 365/189.11 |
| 8,028,406 B2* | 10/2011 | Ding | ....................... | H01P 3/003 |
| | | | | 29/850 |
| 8,130,532 B2* | 3/2012 | Kurjanowicz | ......... | H10B 20/20 |
| | | | | 365/96 |
| 8,295,111 B2* | 10/2012 | Lee | ...................... | G11C 11/4097 |
| | | | | 365/205 |
| 8,809,927 B2* | 8/2014 | Takemura | ............ | H10B 12/315 |
| | | | | 438/156 |
| 8,964,494 B2* | 2/2015 | Lane | .................... | G11C 29/808 |
| | | | | 365/208 |

(Continued)

*Primary Examiner* — Viet Q Nguyen
(74) *Attorney, Agent, or Firm* — Finnegan, Henderson, Farabow, Garrett & Dunner, L.L.P.

(57) ABSTRACT

A memory structure includes a first memory array having bit lines; a second memory array having bit lines; a first sense amplifier connected to a first bit line of the first memory array and a first bit line of the second memory array; and a second sense amplifier connected to a second bit line of the first memory array and a second bit line of the second memory array. The second bit line of the first memory array is adjacent to the first bit line of the first memory array, and the second bit line of the second memory array is adjacent to the first bit line of the second memory array.

20 Claims, 15 Drawing Sheets

(56) References Cited

U.S. PATENT DOCUMENTS

| | | | |
|---|---|---|---|
| 9,259,520 B2* | 2/2016 | Altman | A61M 60/148 |
| 10,957,382 B2* | 3/2021 | Derner | G11C 11/4097 |
| 11,017,843 B2* | 5/2021 | Sharma | H01L 27/1222 |
| 11,069,385 B1* | 7/2021 | Li | G11C 11/404 |
| 11,264,320 B1* | 3/2022 | Eppich | G11C 13/004 |
| 2007/0002601 A1* | 1/2007 | Hasunuma | G11C 7/18 |
| | | | 365/51 |

* cited by examiner

MEMORY CIRCUITS, MEMORY STRUCTURES, AND METHODS FOR FABRICATING A MEMORY DEVICE

REFERENCE TO RELATED APPLICATION

This application claims the benefit of U.S. Provisional Application No. 63/185,314, filed on May 6, 2021, entitled "MEMORY ARRAY ARCHITECTURE," the entirety of which is incorporated by reference herein.

BACKGROUND

Semiconductor memory is electronic data storage implemented on a semiconductor-based integrated circuit and has much faster access times than other types of data storage technologies. Memory cells of semiconductor memory may be dynamic random-access memory ("DRAM") or static random-access memory ("SRAM"). DRAM and SRAM are commonly used in integrated circuits. In some highly integrated devices, embedded memory arrays are provided as part of an integrated circuit that may include circuits and components for additional functionality. For example, system-on-chip ("SoC") devices may provide a processor, program memory, data storage memory, and other functions needed for implementing a system solution.

BRIEF DESCRIPTION OF THE DRAWINGS

Aspects of the present disclosure are best understood from the following detailed description when read with the accompanying figures. It is noted that, in accordance with standard practice in the industry, various features are not drawn to scale. In fact, the dimensions of the various features may be arbitrarily increased or reduced for clarity of discussion.

DETAILED DESCRIPTION

Figure 1:
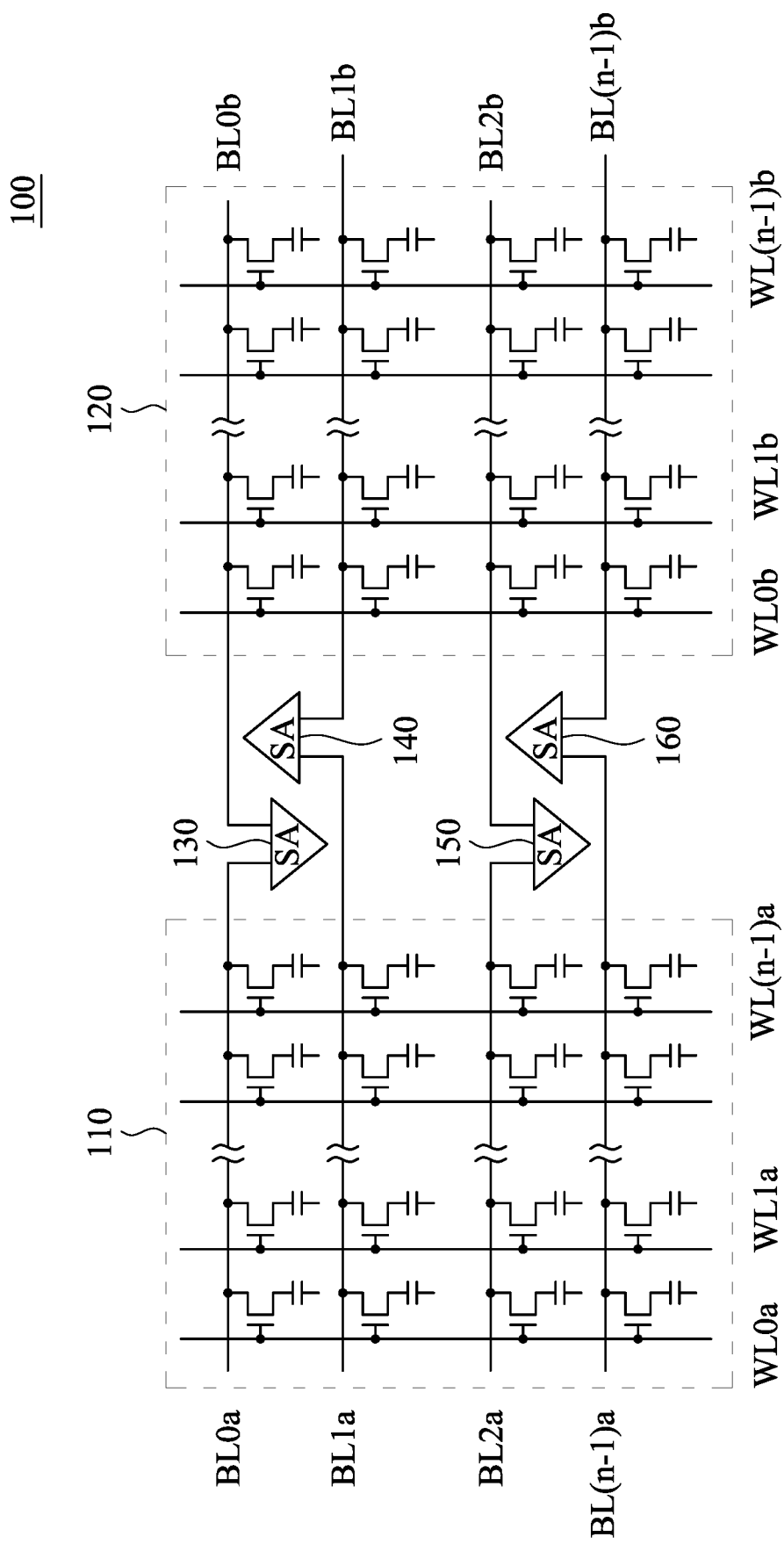
FIG. 1 is a diagram illustrating a memory circuit, in accordance with some embodiments of the present disclosure.

The following disclosure provides many different exemplary embodiments, or examples, for implementing different features of the provided subject matter. Specific simplified examples of components and arrangements are described below to explain the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

The terms used in this specification generally have their ordinary meanings in the art and in the specific context where each term is used. The use of examples in this specification, including examples of any terms discussed herein, is illustrative only, and in no way limits the scope and meaning of the disclosure or of any exemplified term. Likewise, the present disclosure is not limited to various embodiments given in this specification.

Although the terms "first," "second," etc., may be used herein to describe various elements, these elements should not be limited by these terms. These terms are used to distinguish one element from another. For example, a first element could be termed a second element, and, similarly, a second element could be termed a first element, without departing from the scope of the embodiments. As used herein, the term "and/or" includes any and all combinations of one or more of the associated listed items.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In this document, the term "coupled" may also be termed as "electrically coupled", and the term "connected" may be termed as "electrically connected". "Coupled" and "connected" may also be used to indicate that two or more elements cooperate or interact with each other.

Various embodiments of the present disclosure will be described with respect to embodiments in a specific context, namely a back-end-of-line (BEOL) memory circuit having one or more memory arrays, in which devices, such as transistors, are formed in a BEOL process. The concepts in the disclosure may also apply, however, to other semiconductor structures or circuits.

FIG. 1 is a diagram illustrating a memory circuit 100, in accordance with some embodiments of the present disclosure. As shown in FIG. 1, the memory circuit 100 includes memory arrays 110 and 120, and sense amplifier (SA) circuits 130, 140, 150, and 160 electrically coupled to memory arrays 110 and 120. In some embodiments, memory arrays 110 and 120 may be Dynamic random access memory (DRAM) or Static random access memory (SRAM). In the embodiments of FIG. 1, memory arrays 110 and 120 are DRAM memory arrays in which each memory cell includes an access transistor in series with a storage capacitor. The gate terminal of the access transistor is electrically connected to a corresponding word line WL0a-WL(n-1)a or WL0b-WL(n-1)b. A first terminal of the access transistor is electrically connected to a corresponding bit line BL0a-BL(n-1)a or BL0b-BL(n-1)b. A second terminal of the access transistor is electrically connected to one terminal of the storage capacitor. The other terminal of the storage capacitor is electrically connected to a cell plate voltage. It is noted that while the embodiments of FIG. 1 use DRAM arrays as an example for illustration, the basic principles of the present disclosure can be applied to other memory devices, such as SRAM devices.

In the embodiments of FIG. 1, each memory cell stores a single bit and is connected to a corresponding bit line (BL) and a corresponding word line (WL). During read and write operations, the access transistor is configured to control access to the memory cell by selectively connecting the cell to the corresponding bit line. When reading a selected memory cell, a pre-charge voltage is applied and the bit value is transferred from the memory cell to the corresponding bit line, creating a small voltage difference across the bit lines. The corresponding sense amplifier circuit 130, 140, 150, or 160 measures this small voltage difference across the bit lines and translates it to a full logic signal that may be used in digital logic. Accordingly, when the word line is enabled, the corresponding sense amplifier circuit 130, 140, 150, or 160 is configured to sense and output the stored information in the memory cell.

As shown in FIG. 1, each of the sense amplifier circuits 130-160 is electrically coupled to one of the bit lines of the memory array 110, and one of the bit lines of the memory array 120 for detecting the voltage difference across the bit lines. Particularly, a first input terminal of the sense amplifier circuit 130 is electrically coupled to the bit line BL0a of the memory array 110 and a second input terminal of the sense amplifier circuit 130 is electrically coupled to the bit line BL0b of the memory array 120. A first input terminal of the sense amplifier circuit 140 is electrically coupled to the bit line BL1a of the memory array 110 and a second input terminal of the sense amplifier circuit 140 is electrically coupled to the bit line BL1b of the memory array 120. A first input terminal of the sense amplifier circuit 150 is electrically coupled to the bit line BL2a of the memory array 110 and a second input terminal of the sense amplifier circuit 150 is electrically coupled to the bit line BL2b of the memory array 120. A first input terminal of the sense amplifier circuit 160 is electrically coupled to the bit line BL(n-1)a of the memory array 110 and a second input terminal of the sense amplifier circuit 160 is electrically coupled to the bit line BL(n-1)b of the memory array 120.

Figure 2:
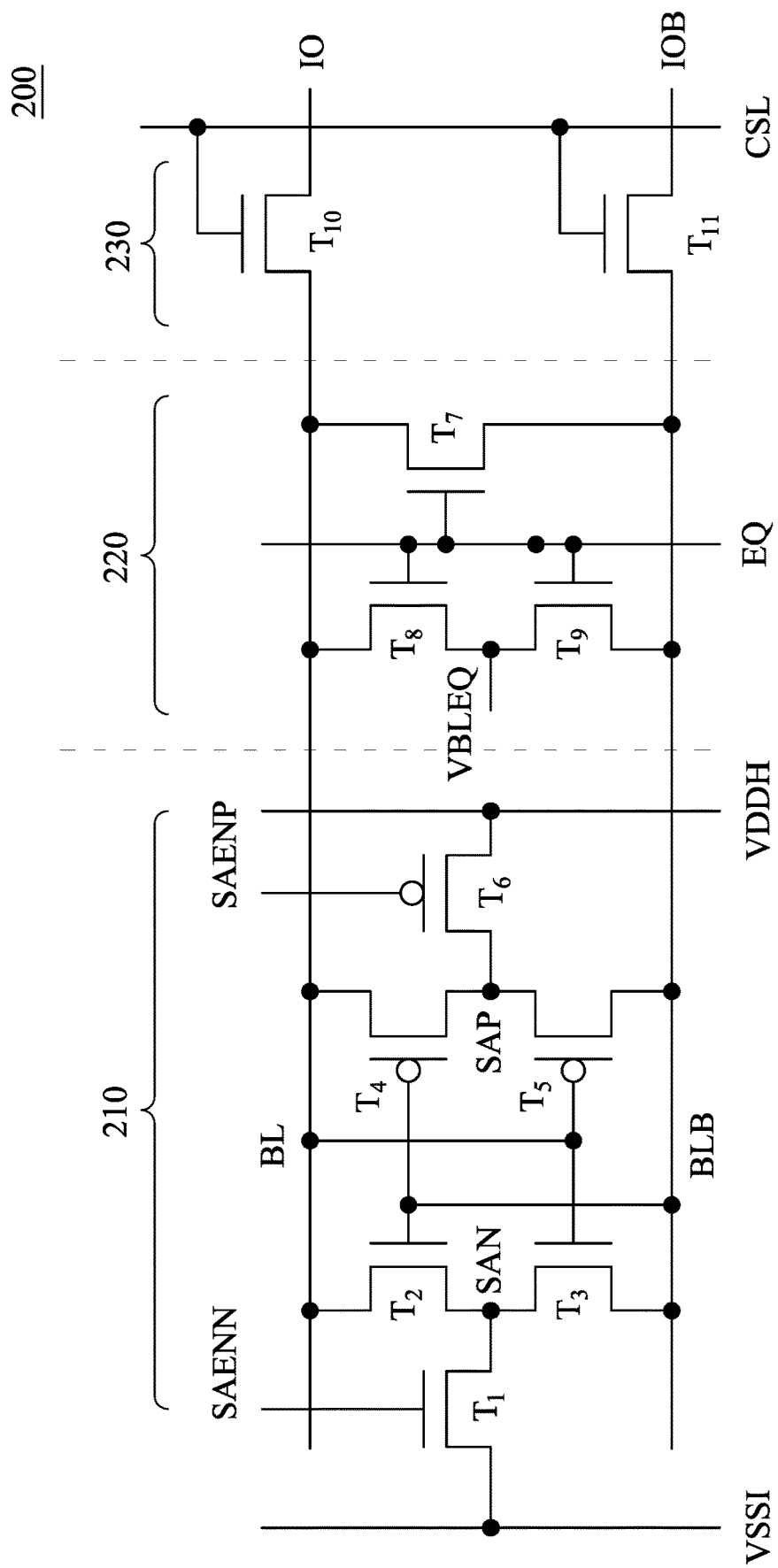
FIG. 2 is a diagram illustrating an exemplary sense amplifier circuit, in accordance with some embodiments of the present disclosure.

FIG. 2 is a diagram illustrating an exemplary sense amplifier circuit 200, in accordance with some embodiments of the present disclosure. As explained above, the sense amplifier circuit 200 is a differential amplifier and operates by receiving a small differential voltage on one of the bit lines (e.g., a local bit line BL which may be connected to a corresponding bit line BL0a-BL(n-1)a of FIG. 1), while the other bit line (e.g., a local bit line BLB which may be connected to another corresponding bit line BL0b-BL(n-1)b of FIG. 1) remains at a reference voltage. In some embodiments, the sense amplifier circuit 130, 140, 150, or 160 shown in FIG. 1 can be realized by the sense amplifier circuit 200 of FIG. 2, but the present disclosure is not limited thereto. For example, the sense amplifier circuit 200 with the pair of local bit lines BL and BLB respectively connected the bit line BL0a and the bit line BL0b can be used as the sense amplifier 130 of FIG. 1 to compare the voltage on the bit line BL0a and the voltage on the bit line BL0b. Similarly, the sense amplifier circuit 200 with the pair of local bit lines BL and BLB connected to corresponding bit lines BL1a, BL2a, or BL(n-1)a, and corresponding bit lines BL1b, BL2b, or BL(n-1)b can, respectively, be used as the sense amplifiers 140, 150, or 160 of FIG. 1 to compare the voltages on the corresponding bit line pair.

As shown in FIG. 2, the sense amplifier circuit 200 includes a bit line sense amplifier (BLSA) 210, an equalizer circuit 220, and an I/O connection circuit 230. The bit line sense amplifier (BLSA) 210 is coupled to the pair of local bit lines BL and BLB. Consistent with the embodiments of FIG. 1, each pair of local bit lines of two adjacent memory arrays 110 and 120 can be coupled to one bit line sense amplifier (BLSA) 210. As explained above, in the sense amplifier 130 of FIG. 1, the bit line sense amplifier (BLSA) 210 is connected to the bit lines BL and BLB of the sense amplifier circuit 200 that are respectively connected to corresponding bit lines BL0a and BL0b in the adjacent memory arrays 110 and 120. Similarly, in the sense amplifiers 140, 150, and 160 of FIG. 1, the bit line sense amplifier (BLSA) 210 is connected to the bit lines BL and BLB of the sense amplifier circuit 200 that are respectively connected to a corresponding bit line pair (e.g., one of the bit lines BL1a, BL2a, and BL(n-1)a in the memory array 110, and the associated one of the bit lines BL1b, BL2b, and BL(n-1)b in the memory array 120).

In some embodiments, the BLSA 210 includes NMOS transistors T1-T3 and PMOS transistors T4-T6. NMOS transistors T2 and T3 are coupled in series between the pair of local bit lines BL and BLB. PMOS transistors T4 and T5 are coupled in series between the pair of local bit lines BL and BLB. Gate terminals of MOS transistors T2 and T4 are coupled to the local bit line BLB. Gate terminals of MOS transistors T3 and T5 are coupled to the local bit line BL.

The NMOS transistor T1 is connected between an internal ground voltage node VSSI and sources terminals of NMOS transistors T2 and T3 and configured as a sense amplifier (SAN) driver for pulling down the source terminals of the NMOS transistors T2 and T3 to the ground voltage, in response to an N-channel sense amplifier enable signal SAENN received at the gate thereof. The PMOS transistor T6 is connected between a power supply voltage node VDDH and source terminals of PMOS transistors T4 and T5 and configured as a sense amplifier (SAP) driver for pulling up the source terminals of the PMOS transistors T4 and T5 to a write voltage, in response to a P-channel sense amplifier enable signal SAENP received at the gate thereof.

During a cell access phase, as a voltage is applied to a corresponding word line, the word line voltage activates the access transistors of the cell. Accordingly, the selected storage cell discharges onto the corresponding bit line. For example, if the voltage in the storage cell represents the digital value "1," the discharging process increases the voltage on the bit line BL from the reference voltage. Accordingly, the voltage on the bit line BL rises to a slightly higher level in response to a read of the digital value "1" during the cell access phase. As the voltage on the bit line BL changes, the slightly higher voltage on the bit line BL begins to drive the NMOS transistor T3 to be more conductive than the NMOS transistor T2. In addition, the voltage difference between the bit lines BL and BLB also drives the PMOS transistor T5 to be less conductive than the PMOS transistor T4. The bit line voltage thus biases the BLSA 210 for an upcoming sensing phase.

During the sensing phase, a corresponding SAN control signal, turns on and drives the voltage on the bit line BLB down. As the SAN turns on, the more conductive NMOS transistor T3 allows the SAN to drive the voltage on the lower bit line down to ground. Similarly, a corresponding SAP control signal drives the bit line BL to a fully restored voltage value that represents the digital value "1" The SAN and SAP control signals thus collectively force the sense amplifier circuit 200, which is a bi-stable circuit, to be driven to the respective maximum or minimum voltage values. In a restoring phase following the sensing phase, after the bit lines BL and BLB are driven to the respective maximum or minimum voltage values, the word line remains active, and the driven bit line voltage now restores the charge in the storage capacitor through the transistor TI or T6. At the same time, the voltage value on the bit lines BL and BLB can be read from of the sense amplifier circuit 200 to provide the requested data.

The equalizer circuit 220 includes NMOS transistors T7-T9. The NMOS transistor T7 is connected between the bit line BL and the bit line BLB, and configured to receive a signal EQ at the gate thereof. The NMOS transistor T8 is connected between a node provided with the potential VBLEQ and the bit line BL, and configured to receive the signal EQ at the gate thereof. The NMOS transistor T9 is connected between the node provided with the potential VBLEQ and the bit line BLB, and configured to receive the signal EQ at the gate thereof.

In each read cycle, before the process of reading data from the memory array begins, the bit lines BL and BLB are pre-charged to the reference voltage during a pre-charge phase. For example, a voltage halfway between the power supply voltage and ground can be used as the reference voltage. In the pre-charge phase, the equalizer circuit 220 is activated to provide the reference voltage for the bit lines BL and BLB. Accordingly, the bit lines BL and BLB are pre-charged to the reference voltage (e.g., potential VBLEQ) when the NMOS transistors T7, T8 and T9 are turned on in the pre-charge phase. Then, in the cell access phase, the sensing phase, and the restoring phase, the equalizer circuit 220 is deactivated.

The I/O connection circuit 230 includes NMOS transistors T10 and T11. The NMOS transistor T10 is connected between a local 10 line 10 and the bit line BL. The gate of the NMOS transistor T10 is connected to a column select line CSL. The NMOS transistor T11 is connected between a local 10 line 10B and the bit line BLB. The gate of the NMOS transistor T11 is connected to the column select line CSL. During the restoring phase following the sensing phase, the I/O connection circuit 230 is activated by a signal on the column select lien CSL to turn on the NMOS transistors T10 and T11. The voltage value on the bit lines BL and BLB are then read out from the sense amplifier circuit 200 to provide the requested data. In this manner, columns of memory cells may be arranged in sub-arrays, and the amplified sensed data can be outputted to the local I/O lines. Accordingly, the data stored in the memory array can be transferred to and from other devices by the operations of the sense amplifier circuit 200.

The bit line sense amplifier 210, the equalizer circuit 220, and the I/O connection circuit 230 of the sense amplifier circuit 200 discussed herein are merely examples. In various embodiments, other circuitry may be used to implement the sense amplifier circuit 130, 140, 150, or 160 for outputting the information stored in memory cells of memory arrays 110 and 120.

Figure 3:
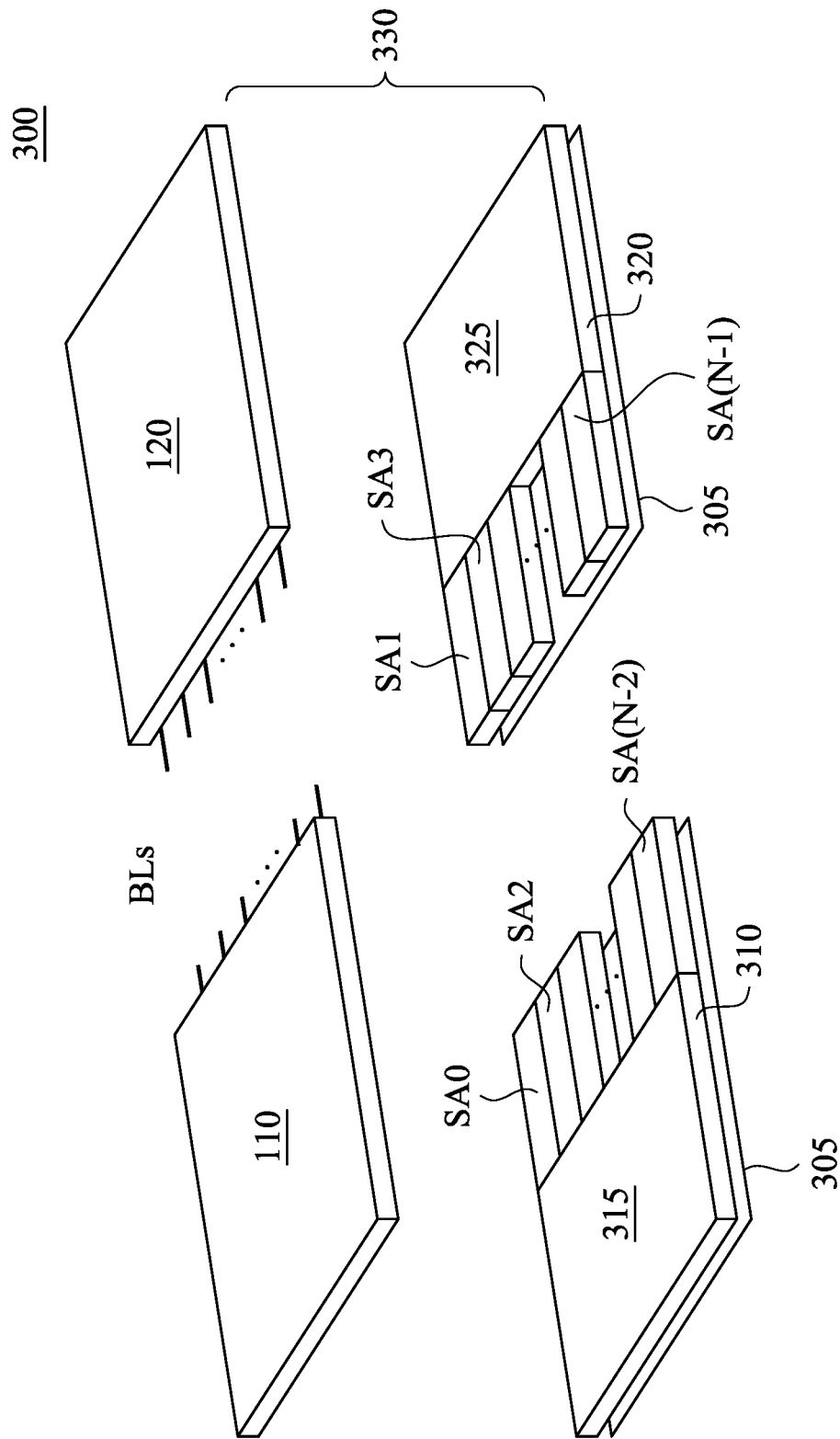
FIG. 3 is a block diagram illustrating a floor plan of a CMOS under array (CuA) memory structure used for the memory circuit illustrated in FIG. 1, in accordance with some embodiments of the present disclosure.

FIG. 3 is a block diagram illustrating a floor plan of a CMOS under array (CuA) memory structure 300 used for the memory circuit 100 illustrated in FIG. 1. In some embodiments, the memory circuit 100 shown in FIG. 1 is formed on a semiconductor substrate and referred to as a memory chip. In addition, for high density storage devices, a three dimensional (3D) stacked memory stack structure can be formed by vertically stacking multiple memory cells. Alternatively stated, memory arrays 110 and 120 may be 3D arrays built using three-dimensional (3D) circuitry.

As shown in the memory structure 300 of FIG. 3, in a front-end-of-line (FEOL) manufacturing process, periphery circuitry 310 and 320 can be formed in or over a substrate layer 305. Periphery circuitry 310 and 320, which include CMOS circuitry, are respectively under the memory arrays 110, 120 to be formed in the BEOL manufacturing process, and therefore are referred to as "CMOS under array." The periphery circuitry 310 and 320 may include logic devices configured to support operation of the memory arrays 110, 120 and/or provide other desired functionality. Conductive interconnects 330 can be formed over the periphery circuitry 310 and 320, and the memory arrays 110, 120 are built on top of the conductive interconnects 330.

As illustrated in FIG. 3, periphery circuitry 310 and 320 include multiple sense amplifiers SA0-SA(N-1) and other control circuit(s) 315 or 325 of the memory circuit 100. For example, sense amplifier circuits 130, 150 shown in FIG. 1 may be formed as the sense amplifiers SA0 and SA2, respectively, within periphery circuitry 310 under the memory array 110, and sense amplifier circuits 140, 160 shown in FIG. 1 may be formed as the sense amplifiers SA1 and SA3, respectively, within periphery circuitry 320 under the memory array 120. As previously described with reference to FIG. 2, in some embodiments, each of sense amplifier SA0-SA(N-1) within the periphery circuitry 310 or 320 is formed by one or more transistor structures connected together. For example, each of the sense amplifier SA0-SA(N-1) can be realized by the sense amplifier circuit 200 of FIG. 2, and formed by transistors T1-T11 arranged in the bit line sense amplifier 210, the equalizer circuit 220, and the I/O connection circuit 230.

In some embodiments, it is possible to fabricate one or more memory arrays using one region of the substrate, and fabricate one or more periphery circuitry adjacent to the memory array(s) using another region of the substrate, with interconnects, such as vias, contacts, and metal lines, between the periphery circuitry, such as the periphery circuitry 310 and/or 320 and the memory array(s), such as the memory arrays 110 and/or 120. It is also possible to form the periphery circuitry partially under the memory array(s) and partially next to the memory array(s). For example, the memory structure 300 may also include a first periphery circuitry region under the memory array(s), and a second periphery circuitry region next to the memory array(s). The components within the first periphery circuitry region and within the second periphery circuitry region can be connected by corresponding contacts, vias, and metal lines structure. In some embodiments, forming the sense amplifier circuits 130-160 and other control circuitry under the memory arrays 110 and 120 can reduce the total chip area of the memory device. By adopting the CuA memory structure, the periphery circuitry can be formed underneath the memory array layers, using an area-efficient layout design and improved transistor scaling, and thus achieve higher memory bit density.

Figure 4:
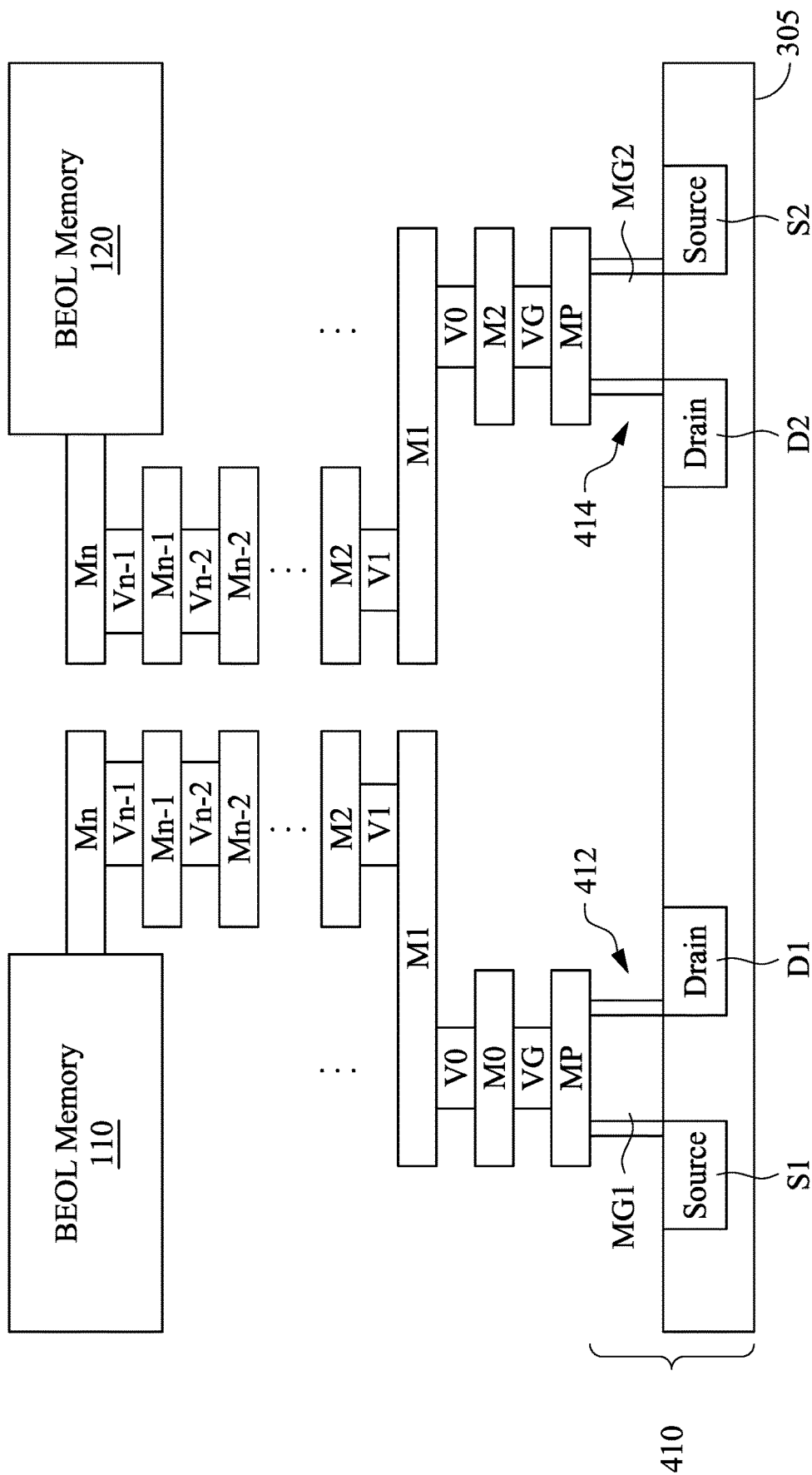
FIG. 4 is an exemplary cross-sectional view of the memory structure of FIG. 3, in accordance with some embodiments of the present disclosure.

FIG. 4 is an exemplary cross-sectional view 400 of the memory structure 300 of FIG. 3, in accordance with some embodiments of the present disclosure. As shown in FIG. 4, conducting layers (e.g., metal layers) M0-Mn and via layers VG-V(N-1) are disposed between FEOL periphery circuitry 410 and the BEOL memory array 110 or the BEOL memory array 120, in which the FEOL periphery circuitry 410 is formed in or over the substrate layer 305 and includes logic devices configured to support operation of the memory arrays 110, 120 and/or provide other desired functionality. As shown in FIG. 4, the periphery circuitry 410 may include CMOS circuitry 412 and 414 having one or more source regions S1, S2, one or more drain regions D1, D2, and one or more metal gate layer MG1, MG2. The conducting layer Mn may include respective conductive features connecting to corresponding bit lines (e.g, bit lines BL0a-BL(n-1)a and BL0b-BL(n-1)b in FIG. 1) of the memory arrays 110, 120.

In FIG. 4, the BEOL memory array 110 is over the CMOS circuitry 412, and the BEOL memory array 120 is over the CMOS circuitry 414. The CMOS circuitry 412 may include one or more first transistor structures (e.g., a transistor structure including a source region S1, a drain region D1 and a metal gate layer MG1) connected to form one or more sense amplifier circuits (e.g., one or more of the sense amplifiers SA0, SA2, ..., SA(N-2) in FIG. 3). Similarly, the CMOS circuitry 414 may also include one or more second transistor structures (e.g., a transistor structure including a source region S2, a drain region D2 and a metal gate layer MG2) connected to form one or more sense amplifier circuits (e.g., one or more of the sense amplifiers SA1 SA3, ..., SA(N-1) in FIG. 3). Referring also to the embodiments of FIG. 1 and FIG. 2, MOS transistors T1-T10 within the sense amplifier circuits 130 and 150 may be formed in the CMOS circuitry 412, and MOS transistors T1-T10 within the sense amplifier circuits 140 and 160 may be formed in the CMOS circuitry 414.

As shown in FIG. 4, a metal poly (MP) layer MP is disposed between the metal gate layer MG1, MG2 and a gate contact layer VG for electrically connecting the metal gate layer MG1, MG2 to an upper-level layer, such as a local metal layer M0. Conducting layers M0-Mn, and via layers V0-V(n-1) disposed between any two conducting layers M0-Mn, form the conductive interconnects 330, connecting the corresponding bit lines of BEOL memory arrays 110, 120 to the corresponding sense amplifiers located in the sense amplifier (SA) region in the CMOS circuitry 412 and 414. Referring also to the embodiments of FIG. 1 and FIG. 2, the metal gate layer MG1 may be the gate terminal of the NMOS transistor T3 within the sense amplifier circuit 130, which is coupled to the bit line BL0a of the memory array 110; and the metal gate layer MG2 may be the gate terminal of the NMOS transistor T2 within the sense amplifier circuit 140, which is coupled to the bit line BL0b of the memory array 120. Similarly, other transistors in the sense amplifier circuit 130 or the sense amplifier circuit 140 can also be formed within the SA region in the CMOS circuitry 412 and 414, with their gate terminals coupled to corresponding bit lines of BEOL memory arrays 110, 120. Same or similar arrangements can be applied to other sense amplifier circuits 150, 160. Thus, multiple sense amplifiers (e.g., the sense amplifier SA0-SA(N-1) in FIG. 3) can be formed in the CMOS under Array memory structure. Accordingly, as shown in FIG. 3 and FIG. 4, the memory structure 300 can achieve high area efficiency and be applied to form a high-density memory device by the CMOS under Array design with two sense amplifiers (e.g., SA0 and SA1 in FIG. 3), instead of a single sense amplifier, arranged in one row under the adjacent memory arrays 110 and 120, for every two bit lines in the layout.

By arranging conductive features in metal layers M0-Mn, and via layers V0-V(n-1) between the BEOL memory arrays 110, 120 and the sense amplifier (SA) region of the FELL periphery circuitry 410, the sense amplifiers within the periphery circuitry 310 under the memory array 110 can be connected to the bit lines of both memory arrays 110 and 120, which will be described in detail with reference to accompanying drawings below. Similarly, the sense amplifiers within the periphery circuitry 320 under the memory array 120 can be connected to the bit lines of both memory arrays 110 and 120. With a proper routing design, bit lines of different memory arrays 110 and 120 can be "swapped" in the conductive interconnects 330, so that two sense amplifiers can be arranged between two adjacent memory arrays 110, 120 in an open bit line architecture. Exemplary routing design will be described in detail with reference to accompanying drawings below.

Figure 5:
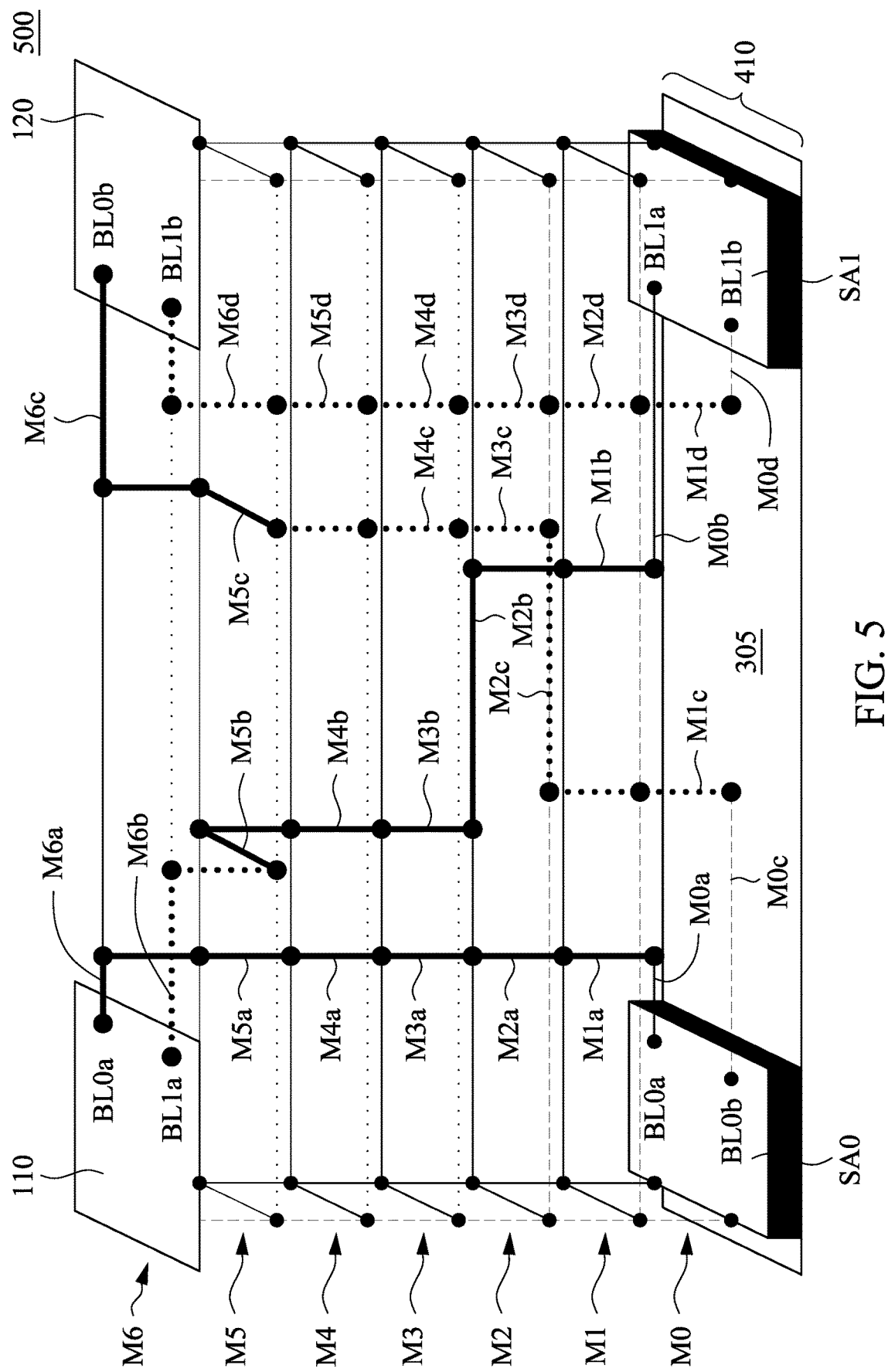
FIG. 5 is a diagram illustrating an exemplary routing of conducting features, in accordance with some embodiments of the present disclosure.

FIG. 5 is a diagram illustrating an exemplary routing 500 of conducting features between memory arrays 110 and 120 and sense amplifiers under and between the memory arrays 110 and 120, in accordance with some embodiments of the present disclosure. As shown in FIG. 5, a first sense amplifier SA0 is connected to the first bit lines BL0a and BL0b in the memory arrays 110 and 120, and a second sense amplifier SA1 is connected to the second bit lines BL1a and BL1b adjacent to the first bit lines BL0a and BL0b in the memory arrays 110 and 120. Alternatively stated, two sense amplifiers can be placed for every two bit lines in the layout, which reduces the memory cell waste in edge memory arrays forming an outer edge of a memory array region, and also reduces an area penalty of the memory device. When only one sense amplifier is placed for every two bit lines in the layout in an open bit line architecture, half of the cells within the two edge memory arrays are not used because only half of the bit lines in the edge memory array can be connected to a corresponding sense amplifier, which results in an area penalty and low array efficiency. In the embodiment of FIG. 5, each bit line in the layout can be connected to the corresponding sense amplifier, so the memory cell waste in edge memory arrays is avoided. Accordingly, overall array efficiency can be improved, and the array cost can be reduced.

As shown in FIG. 5, the FEOL periphery circuitry 410 including sense amplifier circuits SA0 and SA1 is formed over the substrate layer 305. In some embodiments, the sense amplifier circuit SA0 is located within a region under the memory array 110, and the sense amplifier circuit SA1 is located within another region under the memory array 120. Conducting layers M0-M6 are disposed between the FEOL periphery circuitry and the BEOL memory arrays 110 and 120 over the FEOL periphery circuitry. It is noted that conducting layers M0-M6 depicted in FIG. 5 are exemplary and not intended to be limiting. Additional conducting layers may be provided in the routing 500 according to requirements of various applications, which are within the scope of the present disclosure.

In the conducting layers M0-M6, one or more conducting feature(s) M0a-M6a connect the bit line BL0a of the memory array 110 to a terminal of the sense amplifier circuit SA0 under the memory array 110. One or more conducting feature(s) M0c-M6c connect the bit line BL0b of the memory array 120 to another terminal of the sense amplifier circuit SA0 under the memory array 110. Similarly, one or more conducting feature(s) M0b-M6b connect the bit line BL1a of the memory array 110 to a terminal of the sense amplifier circuit SA1 under the memory array 120. One or more conducting feature(s) M0d-M6d connect the bit line BL1b of the memory array 120 to another terminal of the sense amplifier circuit SA1 under the memory array 120.

Figure 6:
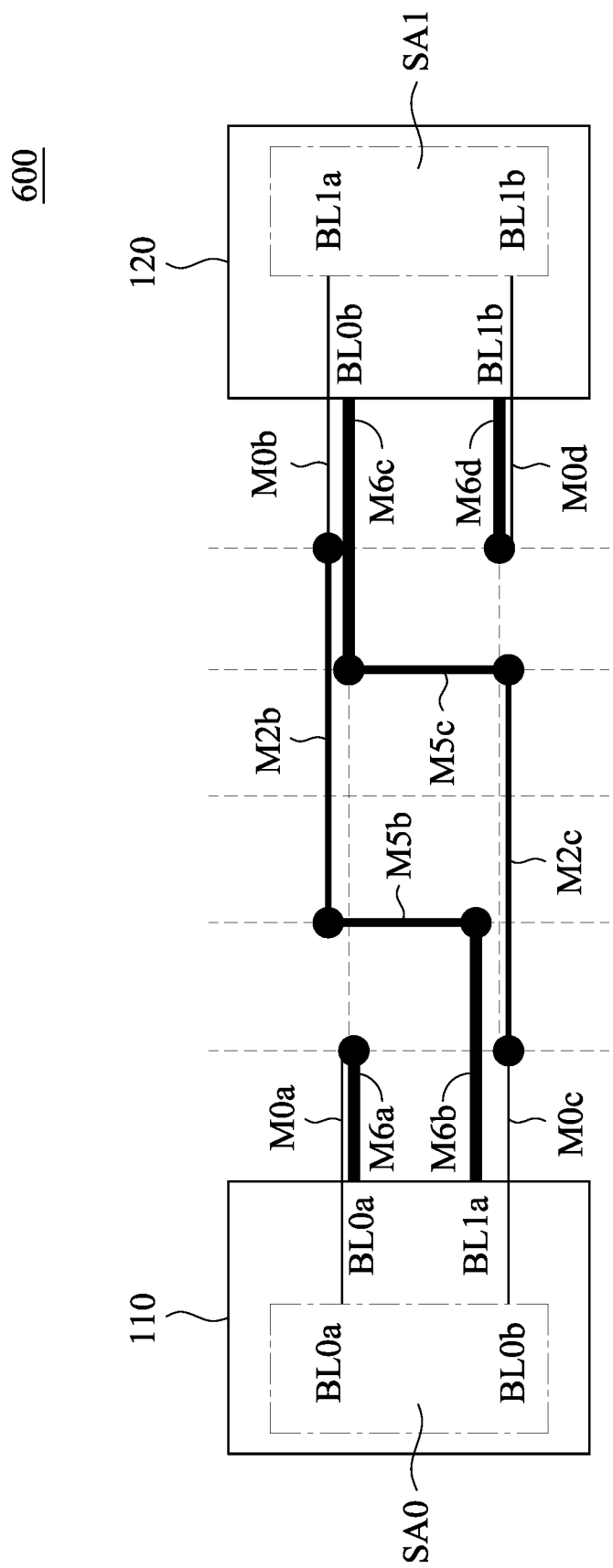
FIG. 6 is a top view diagram of the exemplary routing of conducting features illustrated in FIG. 5, in accordance with some embodiments of the present disclosure.

FIG. 6 is a top view diagram 600 of the exemplary routing 500 of conducting features illustrated in FIG. 5, in accordance with some embodiments of the present disclosure. As shown in FIG. 6, conducting features M2b and M2c are provided within the conducting layer M2 along a first direction. Conducting features M5b and M5c are provided within the conducting layer M5 along a second direction perpendicular to the first direction. By the routings of conducting features realized by conducting features M2b and M2c, M5b and M5c, the conducting layers M0-M6 may achieve the connection between the bit lines and the sense amplifier circuits in different memory arrays.

For example, the bit line BL0a of the memory array 110 is connected to the sense amplifier circuit SA0 under the memory array 110 via conducting features M6a and M0a, and corresponding conducting features M1a-M5a in the conducting layers M1-M5 (shown in FIG. 5). Referring also to FIG. 5, conducting features M6a and M0a are connected via corresponding conducting features M5a, M4a, M1a, M2a, and M1a. The bit line BL1a of the memory array 110 is connected to the sense amplifier circuit SA1 under the memory array 120 via conducting features M6b, M5b, M2b, M0b, and corresponding conducting features M1b, M3b, and M4b in the conducting layers M1, M3, and M4 (shown in FIG. 5). Referring also to FIG. 5, the bit line BL1a is connected to the sense amplifier circuit SA1 via conducting features M6b-M0b. Conducting features M5b and M2b are connected via conducting features M4b and M3b. Conducting features M2b and M0b are connected via the conducting feature M1b. Similarly, the bit line BL0b of the memory array 120 is connected to the sense amplifier circuit SA0 under the memory array 110 conducting features M6c, M5c, M2c, M0c, and corresponding conducting features M1c, M3c, and M4c in the conducting layers M1, M3, and M4 (shown in FIG. 5). Referring also to FIG. 5, the bit line BL0b is connected to the sense amplifier circuit SA0 via conducting features M6c-M0c. Conducting features M5c and M2c are connected via conducting features M4c and M3c. Conducting features M2c and M0c are connected via the conducting feature M1c. The bit line BL1b of the memory array 120 is connected to the sense amplifier circuit SA1 under the memory array 120 via conducting features M6d and M0d, and corresponding conducting features M1d-M5d in the conducting layers M1-M5 (shown in FIG. 5). Referring also to FIG. 5, conducting features M6d and M0d are connected via corresponding conducting features M5d, M4d, M3d, M2d, and M1d.

The routing 500 of conducting features illustrated in FIG. 5 and FIG. 6 are merely examples and not meant to limit the present disclosure. In various embodiments, different arrangements of the conducting features in multiple conducting layers can be applied to achieve the interconnects between the corresponding bit lines of BEOL memory arrays 110, 120 and the corresponding sense amplifiers located in the SA region of the FEOL periphery circuitry 410.

Figure 7:
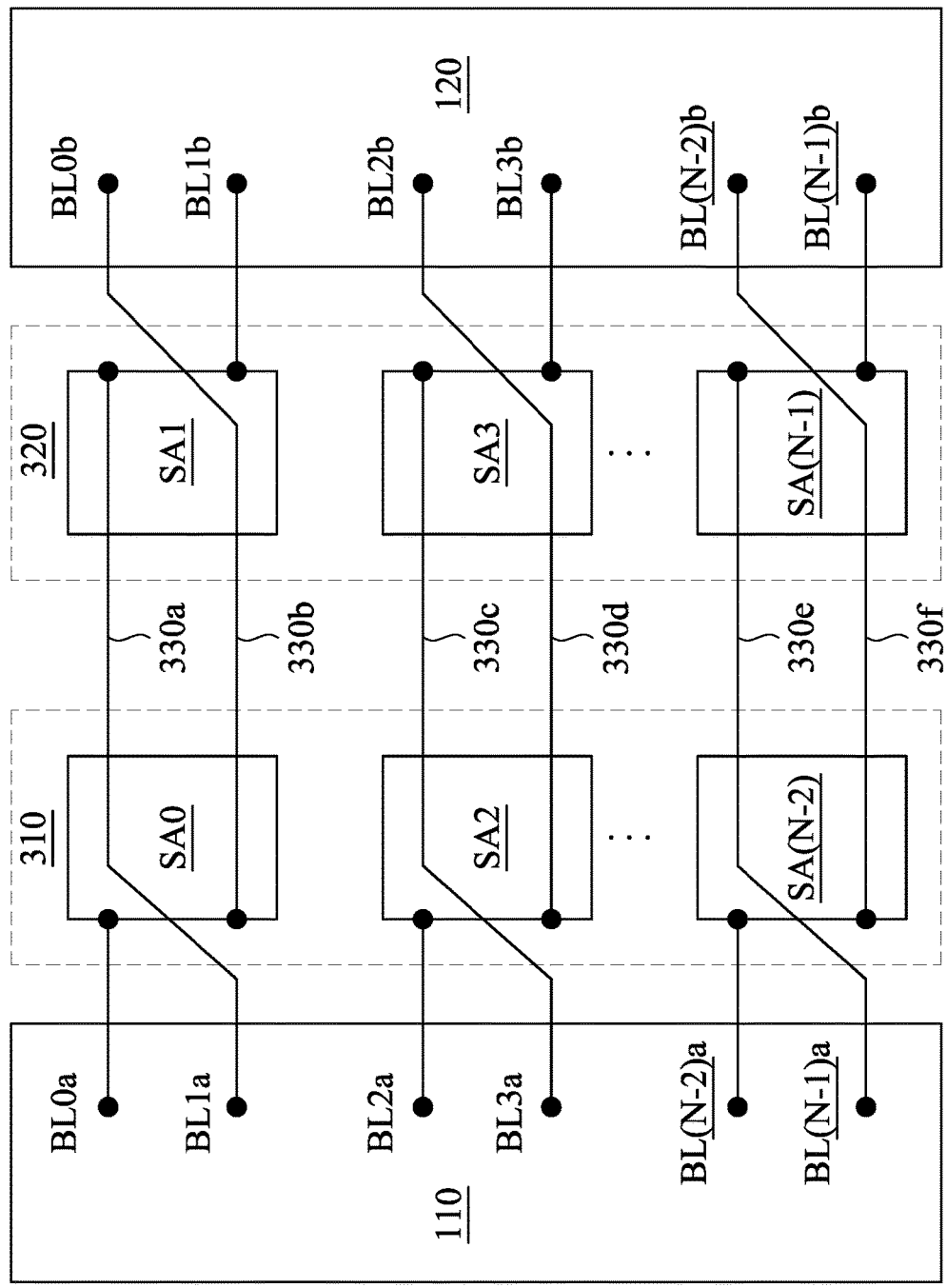
FIG. 7 is a diagram illustrating an exemplary memory structure, in accordance with some embodiments of the present disclosure.

FIG. 7 is a diagram illustrating an exemplary memory structure 700 for implementing the memory circuit 100 of FIG. 1, in accordance with some embodiments of the present disclosure. The arrangement shown in FIG. 7 can be realized by the exemplary routing illustrated in FIG. 5 and FIG. 6. The memory structure 700 includes the memory array 110 and the memory array 120 located within a BEOL structure above the FEOL structure. As shown in the memory structure 700, the memory array 110 includes N bit lines BL0a-BL(N-1)a, and the memory array 120 adjacent to the memory array 110 includes N bit lines BL0b-BL(N-1)b. Particularly, the bit line BLxa of the memory array 110 and the bit line BLxb of the memory array 120 form a pair of local bit lines associated with the (x+1)th row of the memory arrays 110 and 120 in the memory structure 700, and couple to the same sense amplifier Sax, in which x is any number between 0 to (N-1).

As shown in FIG. 7, the memory structure 700 includes N sense amplifiers SA0-SA(N-1) located within the FEOL structure of the memory structure 700. Each of the sense amplifiers SA0-SA(N-1) is coupled to a pair of the bit lines associated with a row of the memory arrays 110 and 120. For example, as shown in FIG. 7, the sense amplifier SA0 is connected to the bit line BL0a of the memory array 110 and the bit line BL0b of the memory array 120. The sense amplifier SA1 is connected to the bit line BL1a of the memory array 110 and the bit line BL1b of the memory array 120. The sense amplifier SA2 is connected to the bit line BL2a of the memory array 110 and the bit line BL2b of the memory array 120, and so on.

In the embodiments of FIG. 7, the bit lines BL0a-BL(N-1)a of the memory array 110 are aligned with respect to the bit lines BL0b-BL(N-1)b of the memory array 120, in which the bit lines BL1a and BL1b are respectively adjacent to the bit lines BL0a and BL0b. By "swapping" the bit line BL1a and the bit line BL0b through conductive interconnects 330a and 330b, the sense amplifier SA0 and the sense amplifier SA1 coupled to the adjacent bit line pairs (e.g., bit lines BL0a and BL0b, and bit lines BL1a and BL1b) can be placed in the same row in the FEOL periphery circuitry 410 under the memory arrays 110 and 120. For example, the conductive interconnects 330a and 330b can be implemented by the routing 500 shown in FIG. 5 and FIG. 6, For example, the conductive interconnect 330a may include conducting features M0b-M6b shown in FIG. 5 and corresponding vias between any two neighboring conducting layers M0-M6. Similarly, the conductive interconnect 330b may include conducting features M0c-M6c shown in FIG. 5 and corresponding vias between any two neighboring conducting layers M0-M6.

Similarly, the sense amplifier SA2 and the sense amplifier SA3 coupled to the adjacent bit line pairs (e.g., bit lines BL2a and BL2b, and bit lines BL3a and BL3b) are also placed in the same row in the FEOL periphery circuitry 410 under the memory arrays 110 and 120, by "swapping" the bit line BL3a and the bit line BL2b through conductive interconnects 330c and 330d. The sense amplifier SA(N-2) and the sense amplifier SA(N-1) are also placed in the same row in the FEOL periphery circuitry 410 by "swapping" the bit line BL(N-1)a and the bit line BL(N-2)b through conductive interconnects 330e and 330f.

In the embodiments of FIG. 7, the two sense amplifiers (e.g., SA0 and SA1) in the same row are located in different FEOL regions. For example, one sense amplifier (e.g., the sense amplifier SA0) is located within a first FEOL region (e.g., the region for the periphery circuitry 310) under the memory array 110, and the other sense amplifier (e.g., the sense amplifier SA1) is located within a second FEOL region (e.g., the region for the periphery circuitry 320) under the memory array 120. Accordingly, the adjacent bit lines of the same memory array are respectively connected to the sense amplifiers located under different memory arrays. For example, the odd numbered bit lines BL0a to BL(N-2)a of the memory array 110 are respectively connected to the sense amplifiers SA0 to SA(N-2) located in the periphery circuitry 310 under the memory array 110, while the even numbered bit lines BL1a to BL(N-1)a of the memory array 110 are respectively connected to the sense amplifiers SA1 to SA(N-1) located in the periphery circuitry 320 under the memory array 120. Similarly, the odd numbered bit lines BL0b to BL(N-2)b of the memory array 120 are respectively connected to the sense amplifiers SA0 to SA(N-2) located in the periphery circuitry 310 under the memory array 110, while the even numbered bit lines BL1b to BL(N-1)b of the memory array 120 are respectively connected to the sense amplifiers SA1 to SA(N-1) located in the periphery circuitry 320 under the memory array 120.

Figure 8:
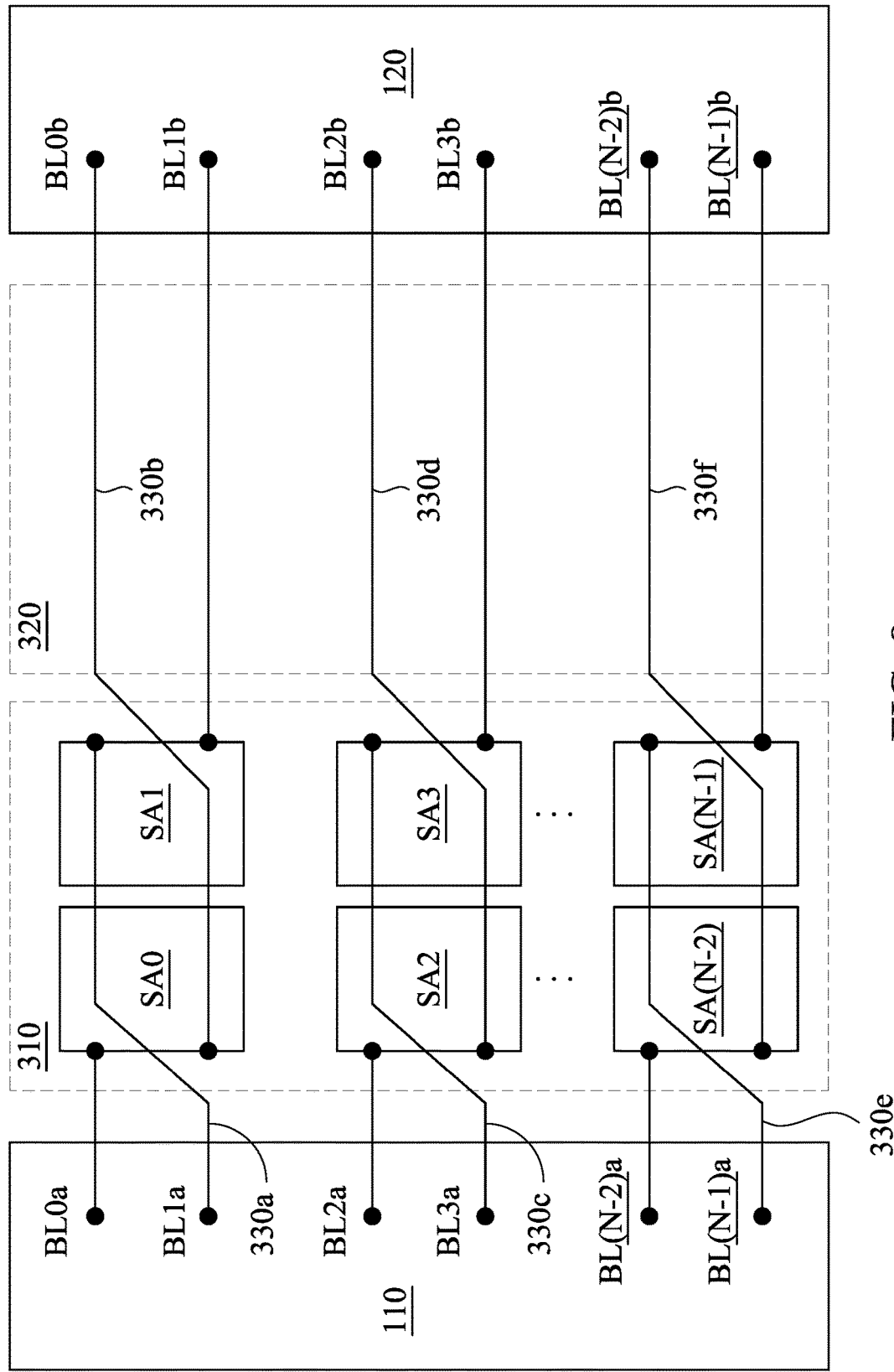
FIG. 8 is a diagram illustrating another exemplary memory structure, in accordance with some embodiments of the present disclosure.

FIG. 8 is a diagram illustrating another exemplary memory structure 800 for implementing the memory circuit 100 of FIG. 1, in accordance with some embodiments of the present disclosure. Compared to the embodiments of FIG. 7, in the memory structure 800, the sense amplifiers SA0-SA(N-1) are located in the same FEOL region. As shown in FIG. 8, for example, both sense amplifiers (e.g., the sense amplifier SA0 and SA1) in the same row can be located within the region for the periphery circuitry 310 under the memory array 110. In some other embodiments, the sense amplifiers SA0-SA(N-1) can instead be located within the region for the periphery circuitry 320 under the memory array 120.

Similar to the embodiments shown in FIG. 7, the bit lines BL0a-BL(N-1)a of the memory array 110 are aligned with respect to the bit lines BL0b-BL(N-1)b of the memory array 120, the sense amplifier SA0 and the sense amplifier SA1 coupled to the adjacent bit line pairs (e.g., bit lines BL0a and BL0b, and bit lines BL1a and BL1b) are placed in the same row in the periphery circuitry 310 under the memory array 110 by "swapping" the bit line BL1a and the bit line BL0b through the conductive interconnects 330a and 330b.

Figure 9:
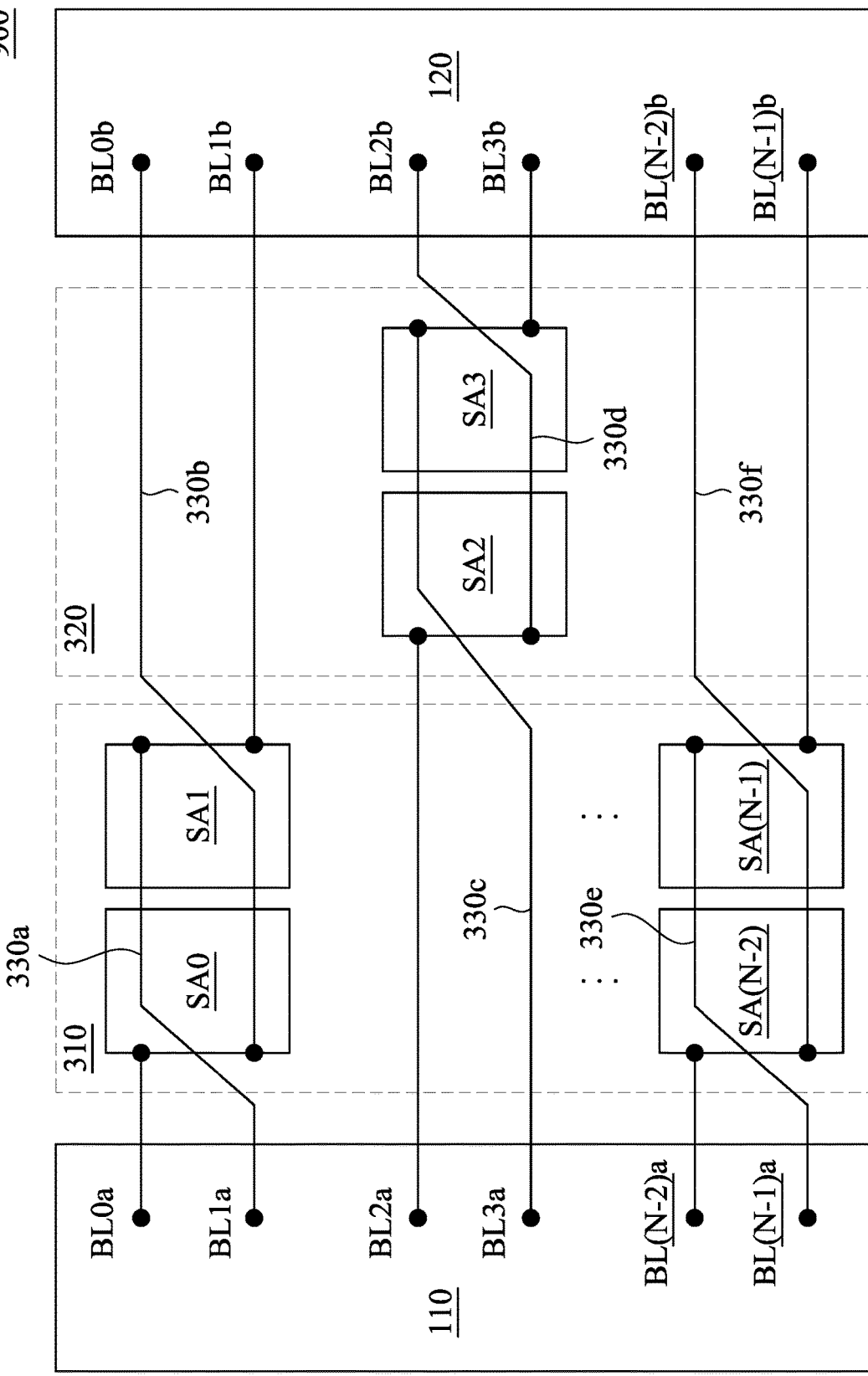
FIG. 9 is a diagram illustrating another exemplary memory structure, in accordance with some embodiments of the present disclosure.

FIG. 9 is a diagram illustrating another exemplary memory structure 900 for implementing the memory circuit 100 of FIG. 1, in accordance with some embodiments of the present disclosure. Compared to the embodiments of FIG. 8, in the memory structure 900, the sense amplifiers SA0-SA(N-1) can be alternately located between the periphery circuitry 310 under the memory array 110 and the periphery circuitry 320 under the memory array 120, while the sense amplifiers in the same row are located within the same periphery circuitry. For example, the sense amplifier SA0 and SA1 in the first row are located within the periphery circuitry 310 under the memory array 110, and the sense amplifier SA2 and SA3 in the next row are located within the periphery circuitry 320 under the memory array 120.

Similar to the embodiments shown in FIG. 7 and FIG. 8, the bit lines BL0a-BL(N-1)a of the memory array 110 are aligned with respect to the bit lines BL0b-BL(N-1)b of the memory array 120. Two sense amplifiers can placed in the same row in the periphery circuitry 310 under the memory array 110 by "swapping" the bit lines through the conductive interconnects 330a-330f.

In some other embodiments, other arrangements may also be possible. For example, the sense amplifiers SA0-SA3 in the first two rows can be located within the periphery circuitry 310 under the memory array 110, and the sense amplifiers in the next two rows can be located within the periphery circuitry 320 under the memory array 120. In some embodiments, the sense amplifiers SA0 and SA1 in one row can be located within the same periphery circuitry 310 or 320, while the sense amplifiers SA2 and SA3 in another row can be located within a different one of periphery circuitry 310 and 320 respectively. The arrangements illustrated in FIG. 7 to FIG. 9 are merely examples and not meant to limit the present disclosure.

Figure 10:
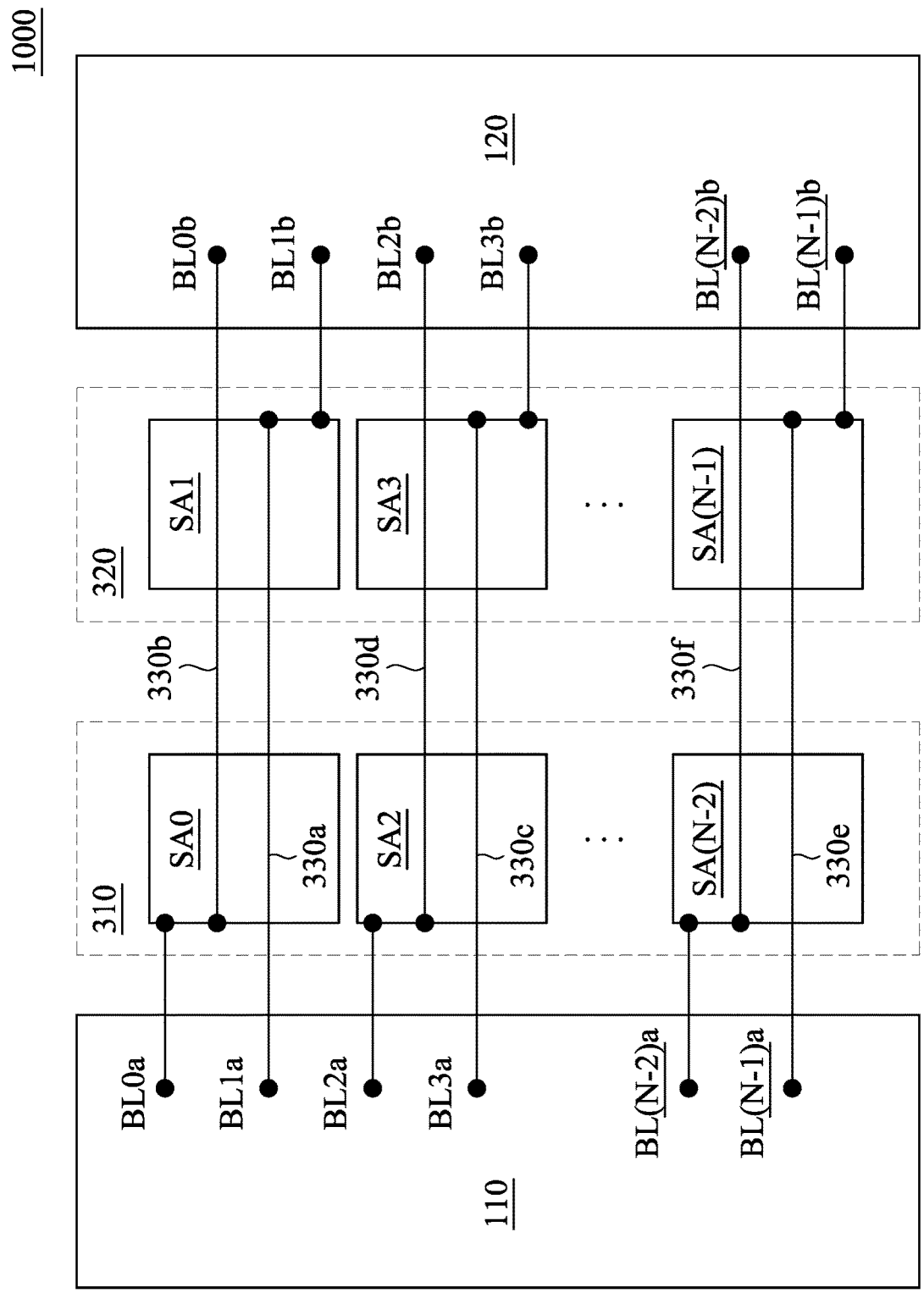
FIG. 10 is a diagram illustrating another exemplary memory structure, in accordance with some embodiments of the present disclosure.
Figure 11:
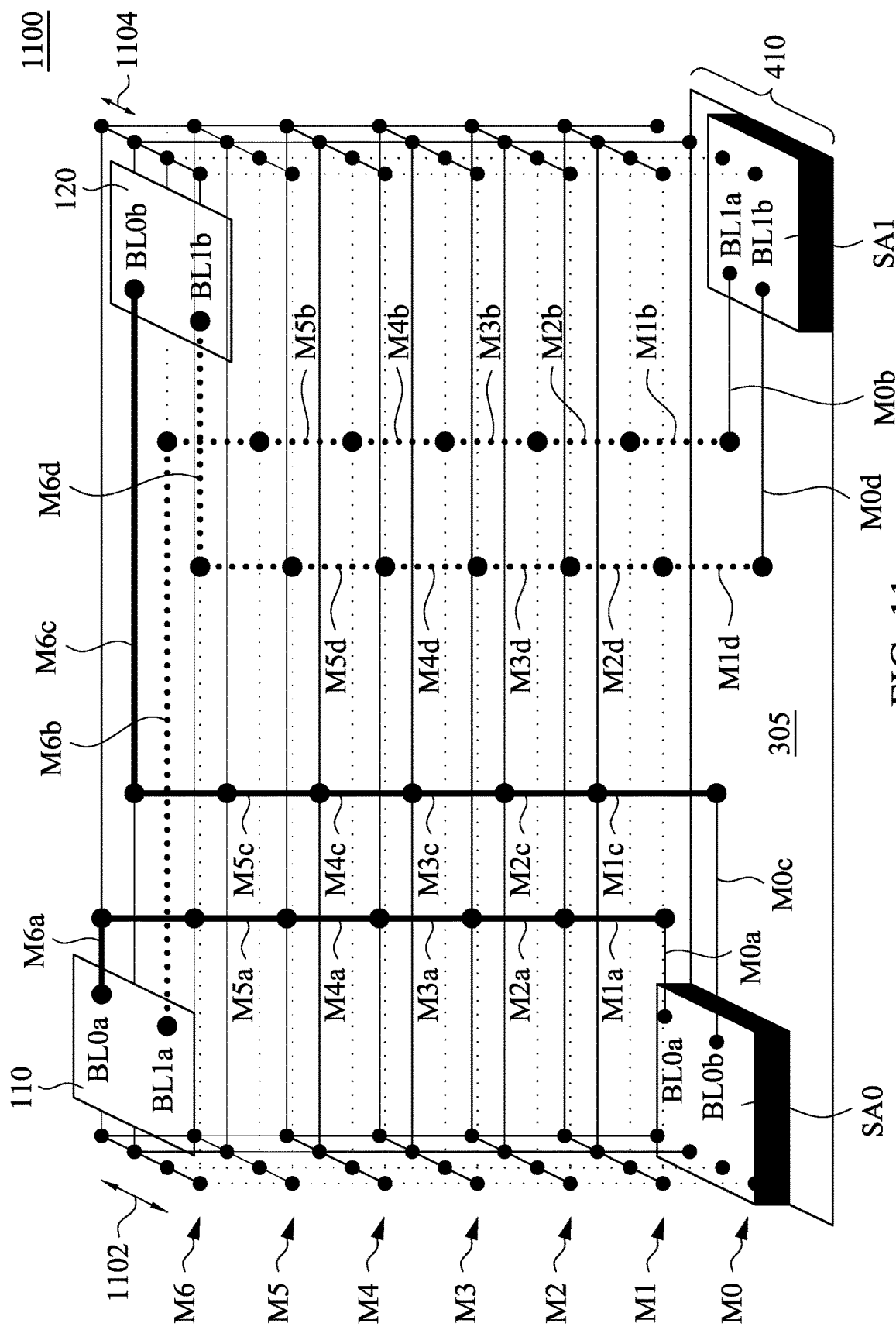
FIG. 11 is a diagram illustrating an exemplary routing of conducting features, in accordance with some embodiments of the present disclosure.
Figure 12:
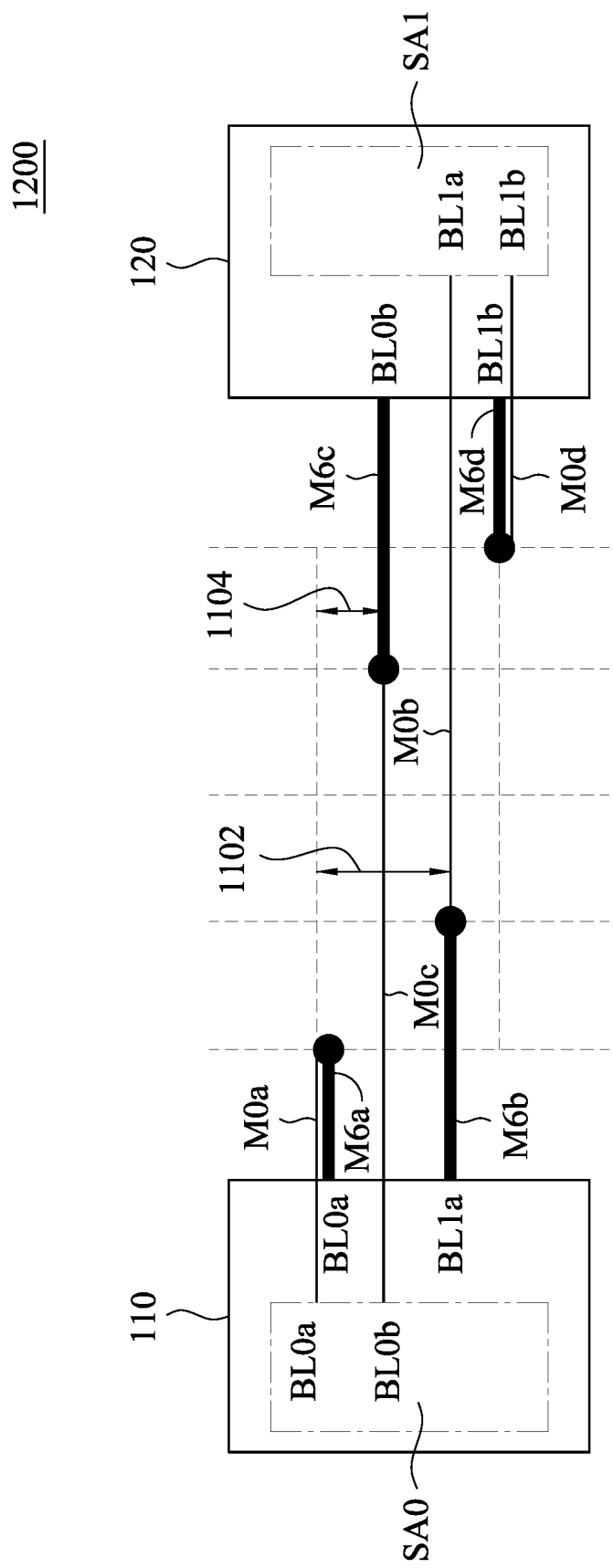
FIG. 12 is a top view diagram of the exemplary routing of conducting features illustrated in FIG. 11, in accordance with some embodiments of the present disclosure.

FIG. 10 is a diagram illustrating another exemplary memory structure 1000 for implementing the memory circuit 100 of FIG. 1, in accordance with some embodiments of the present disclosure. Compared to the embodiments of FIGS. 7-9, in the memory structure 1000, the bit lines BL0a-BL(N-1)a of the memory array 110 have an offset with respect to the corresponding bit lines BL0b-BL(N-1)b of the memory array 120. Accordingly, the pair of bit lines in the adjacent memory arrays 110 and 120 may be not aligned to each other. For example, in the embodiments of FIG. 10, the bit lines BL0a-BL(N-1)a of the memory array 110 are displaced from the bit lines BL0b-BL(N-1)b of the memory array 120 by a half pitch of the bit lines. Detailed layout of the displacement is described below with reference to FIG. 11 and FIG. 12. By providing the offset between the memory arrays 110 and 120, the sense amplifier SA0 and the sense amplifier SA1 are respectively coupled to the adjacent bit line pairs (e.g., bit lines BL0a and BL0b, and bit lines BL1a and BL1b) with simplified conductive interconnects 330a-330f, without "swapping" the bit lines through the conductive interconnects. The simplified layout without swapping the bit lines is depicted in FIG. 11 and FIG. 12. Compared to the embodiments shown in FIG. 5 and FIG. 6, conducive features M5b, M5c, M2b and M2c for swapping the bit lines can be modified to simplify the connection between the memory arrays 110 and 120, and the sense amplifiers SA0 and SA1.

FIG. 11 is a diagram illustrating an exemplary routing 1100 of conducting features between memory arrays 110 and 120 and sense amplifiers under and between the memory arrays 110 and 120 for the memory structure 1000 of FIG. 10, in accordance with some embodiments of the present disclosure. Compared to the routing illustrated in FIG. 5, in the routing 1100 of FIG. 11, one or more conducting feature(s) M0a-M6a in the conducting layers M0-M6 connect the bit line BL0a of the memory array 110 to a terminal of the sense amplifier circuit SA0 under the memory array 110. One or more conducting feature(s) M0c-M6c connect the bit line BL0b of the memory array 120 to another terminal of the sense amplifier circuit SA0 under the memory array 110. Similarly, one or more conducting feature(s) M0b-M6b connect the bit line BL1a of the memory array 110 to a terminal of the sense amplifier circuit SA1 under the memory array 120. One or more conducting feature(s) M0d-M6d connect the bit line BL1b of the memory array 120 to another terminal of the sense amplifier circuit SA1 under the memory array 120. As shown in FIG.

11, the bit line BL0a is displaced from the bit line BL0b by a distance 1104, which is half of a pitch 1102 between the bit lines BL0a and BL1a.

FIG. 12 is a top view diagram of the exemplary routing 1100 of conducting features illustrated in FIG. 11 in accordance with some embodiments of the present disclosure. As shown in FIG. 12, by the routings of conducting features realized by conducting features M0a-M0d in the conducting layer M0 and by conducting features M6a-M6d in the conducting layer M6, the connection between the bit lines and the sense amplifier circuits in different memory arrays can be achieved by the conducting layers M0-M6. For example, the bit line BL0a of the memory array 110 is connected to the sense amplifier circuit SA0 under the memory array 110 via conducting features M6a and M0a, and corresponding conducting features M1a-M5a in the conducting layers M1-M5 (shown in FIG. 11) Referring also to FIG. 11, conducting features M6a and M0a are connected via corresponding conducting features M5a, M4a, M3a, M2a, and M1a. The bit line BL1a of the memory array 110 is connected to the sense amplifier circuit SA1 under the memory array 120 via conducting features M6b and M0b, and corresponding conducting features M1b-M5b in the conducting layers M1-M5 (shown in FIG. 11). Referring also to FIG. 11, conducting features M6b and M0b are connected via corresponding conducting features M5b, M4b, M3b, M2b, and M1b.

Similarly, the bit line BL0b of the memory array 120 is connected to the sense amplifier circuit SA0 under the memory array 110 via conducting features M6c and M0c, and corresponding conducting features M1c-M5c in the conducting layers M1-M5 (shown in FIG. 11). Referring also to FIG. 11, conducting features M6c and M0c are connected via corresponding conducting features M5c, M4c, M3c, M2c, and M1c. The bit line BL1b of the memory array 120 is connected to the sense amplifier circuit SA1 under the memory array 120 via conducting features M6d and M0d, and corresponding conducting features M1d-M5d in the conducting layers M1-M5 (shown in FIG. 11). Referring also to FIG. 11 conducting features M6d and M0d are connected via corresponding conducting features M5d, M4d, M3d, M2d, and M1d. The exemplary routing 1100 of conducting features illustrated in FIG. 11 and FIG. 12 are merely examples and not meant to limit the present disclosure.

Figure 13:
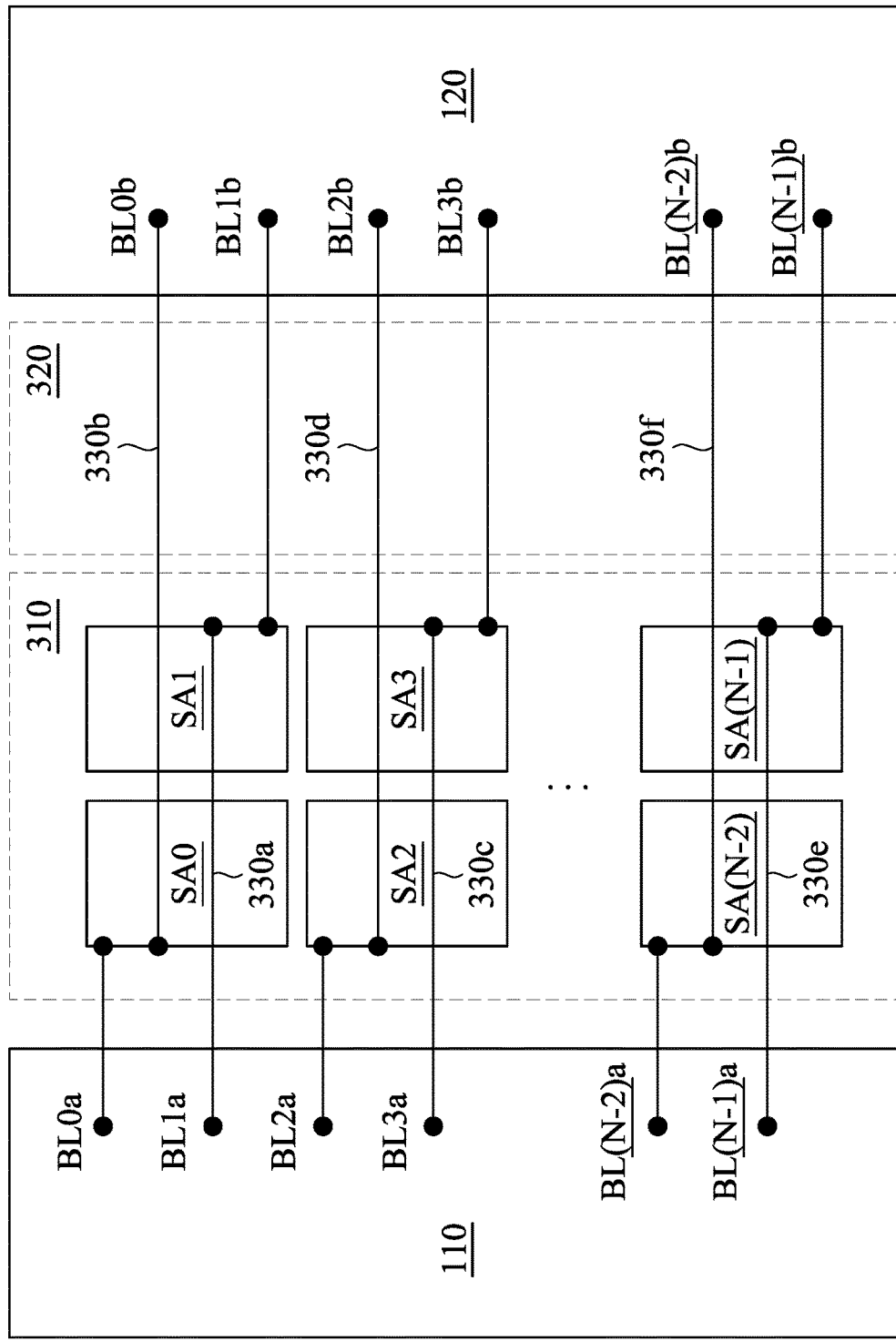
FIG. 13 is a diagram illustrating another exemplary memory structure, in accordance with some embodiments of the present disclosure.

FIG. 13 is a diagram illustrating another exemplary memory structure 1300 for implementing the memory circuit 100 of FIG. 1, in accordance with some embodiments of the present disclosure. Compared to the embodiments of FIG. 10, in the memory structure 1300, the sense amplifiers SA0-SA(N-1) are located in the same FEOL region. As shown in FIG. 13, for example, both sense amplifiers (e.g., the sense amplifiers SA0 and SA1) in the same row can be located within the region for the periphery circuitry 310 under the memory array 110. In some other embodiments, the sense amplifiers SA0-SA(N-1) can also be located within the region for the periphery circuitry 320 under the memory array 120.

Similar to the embodiments shown in FIG. 10, the bit lines BL0a-BL(N-1)a of the memory array 110 are displaced from the bit lines BL0b-BL(N-1)b of the memory array 120 by a half pitch of the bit lines. Accordingly, the sense amplifier SA0 and the sense amplifier SA1 are respectively coupled to the adjacent bit line pairs (e.g., bit lines BL0a and BL0b, and bit lines BL1a and BL1b) by simplified conductive interconnects, without "swapping" the bit lines. For example, the sense amplifiers SA0 and SA1 can be connected to the bit lines BL0a, BL0b, and the bit lines BL1a, BL1b by the routing proposed in FIG. 11 and FIG. 12.

Figure 14:
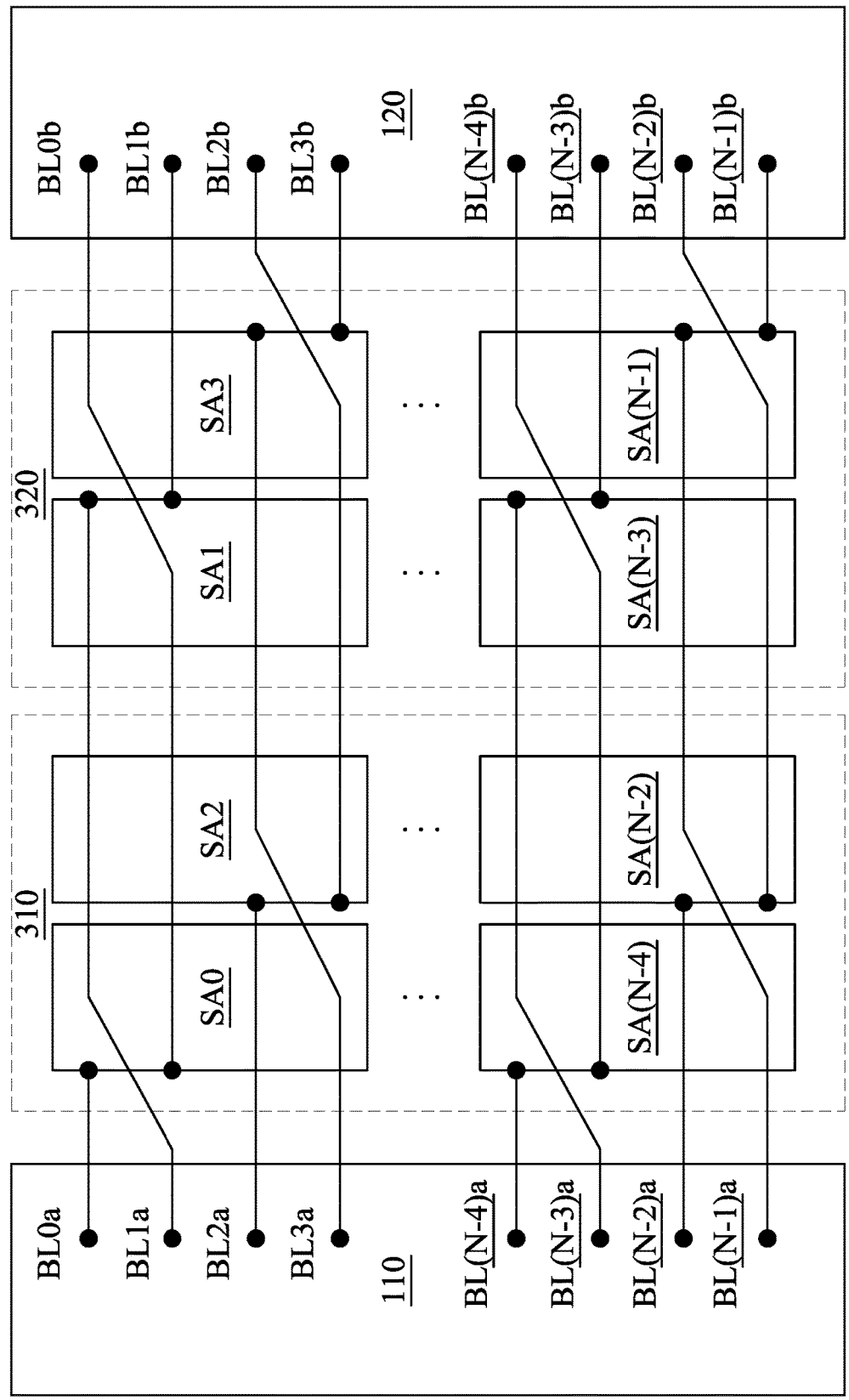
FIG. 14 is a diagram illustrating another exemplary memory structure, in accordance with some embodiments of the present disclosure.

FIG. 14 is a diagram illustrating another exemplary memory structure 1400 for implementing the memory circuit 100 of FIG. 1, in accordance with some embodiments of the present disclosure. Compared to the embodiments of FIGS. 7-13, in the memory structure 1400, the sense amplifiers SA0-SA(N-1) can be stacked to reduce the FEOL layout size required by the sense amplifiers SA0-SA(N-1). As shown in FIG. 14, the sense amplifiers SA0 and SA2 can be stacked within the region for the periphery circuitry 310 under the memory array 110. Similarly, the sense amplifiers SA1 and SA3 can be stacked within the region for the periphery circuitry 320 under the memory array 120. The stacked sense amplifiers SA0-SA(N-1) are respectively connected to the corresponding bit line pairs using proper routing in the conductive layers M0-M6 disposed between the FEOL periphery circuitry 310 or 320 and the BEOL memory arrays 110 or 120. In various embodiments, the stacked number of the stacked sense amplifier arrangement can be equal to or greater than 2. Accordingly, the embodiments of FIG. 14 are merely by examples and not meant to limit the present disclosure.

Figure 15:
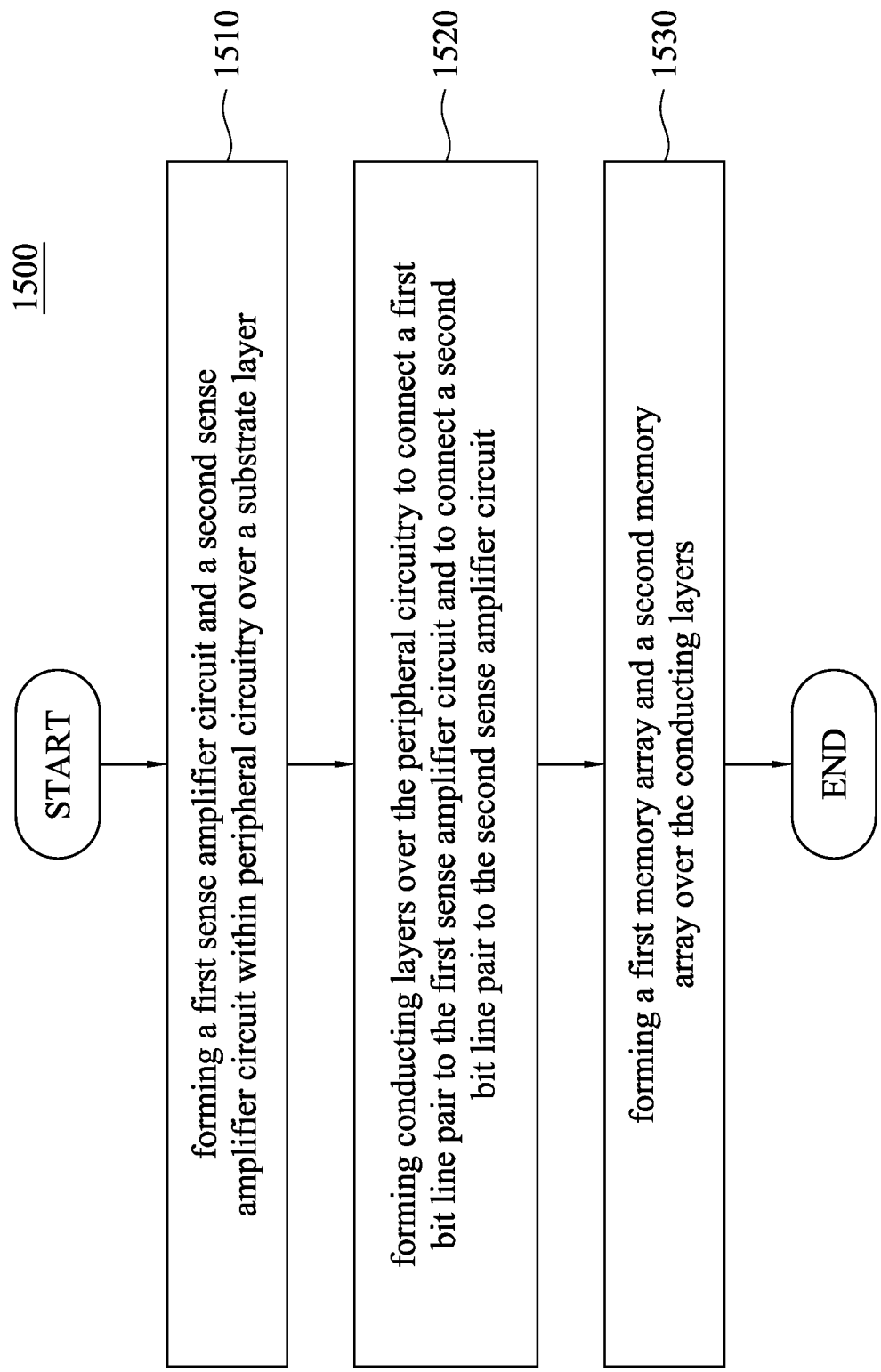
FIG. 15 is a flowchart of a method for fabricating a memory device in accordance with some embodiments of the present disclosure.

FIG. 15 is a flowchart of a method 1500 for fabricating a memory device in accordance with some embodiments of the present disclosure. It is understood that additional operations may be performed before, during, and/or after the method 1500 depicted in FIG. 15, and that some other processes may only be briefly described herein. The method 1500 can be performed for fabricating the memory circuit or the memory structure illustrated in any of FIGS. 1-14, but the present disclosure is not limited thereto.

In operation 1510, a first sense amplifier circuit and a second sense amplifier circuit are formed within front-end-of-line (FEOL) periphery circuitry over a substrate layer. In operation 1520, conducting layers are formed over the FEOL periphery circuitry. In operation 1530, a first BEOL memory array and a second BEOL memory array are formed over the conducting layers.

In some embodiments, in operation 1510, the first sense amplifier circuit is formed by providing one or more first transistor structures connected to each other within the FEOL periphery circuitry. Similarly, the second sense amplifier circuit is formed by providing one or more second transistor structures connected to each other within the FEOL periphery circuitry. In some embodiments, the first sense amplifier circuit and the second sense amplifier circuit can be placed in different FEOL regions under different BEOL memory arrays. In some embodiments, the first sense amplifier circuit and the second sense amplifier circuit can be placed in the same FEOL region under the same BEOL memory array.

In operation 1520, the conducting layers are formed and disposed between the FEOL periphery circuitry and the first BEOL memory array or the second BEOL memory array, to connect a first bit line pair (e.g., a first bit line of the first memory array and a first bit line of the second memory array) to the first sense amplifier circuit and to connect a second bit line pair (e.g., a second bit line of the first memory array and a second bit line of the second memory array) to the second sense amplifier circuit. As shown in FIGS. 1-14, the second bit line pair is the bit line pair adjacent to the first bit line pair.

In some embodiments, in operation 1520, the conducting layers are formed by forming one or more first conducting features connecting the first bit line of the first memory array to a first input node of the first sense amplifier circuit, forming one or more second conducting features connecting the first bit line of the second memory array to a second input node of the first sense amplifier circuit, forming one or more third conducting features connecting a second bit line of the first memory array to a first input node of the second sense amplifier circuit, and forming one or more fourth conducting features connecting a second bit line of the second memory array to a second input node of the second sense amplifier circuit.

In some embodiments, in operation 1530, the first memory array and the second memory array are formed by displacing bit lines of the first memory array from the bit lines of the second memory array by an offset. In some other embodiments, the first memory array and the second memory array are formed by aligning the bit lines of the first memory array with respect to the bit lines of the second memory array.

By the operations described above, a method for fabricating a memory device can be performed accordingly to provide a memory circuit with lower area penalty and a better array efficiency by placing two sense amplifier circuits for two adjacent bit line pairs between two memory arrays, such as in the memory structures illustrated in FIGS. 7-10, 13, and 14. Accordingly, the fabricated memory devices provide increased efficiency of memory use with reduced waste of memory cells, which results in a smaller size and a lower cost of the memory chip.

In some embodiments, a memory circuit is disclosed that includes a first memory array having a plurality of bit lines; a second memory array having a plurality of bit lines; a first sense amplifier connected to a first bit line of the first memory array and a first bit line of the second memory array; and a second sense amplifier connected to a second bit line of the first memory array and a second bit line of the second memory array. The second bit line of the first memory array is adjacent to the first bit line of the first memory array, and the second bit line of the second memory array is adjacent to the first bit line of the second memory array.

In some embodiments, a memory structure is also disclosed that includes a substrate layer, front-end-of-line (FEOL) periphery circuitry formed in or over the substrate layer, the FEOL periphery circuitry including a first sense amplifier circuit and a second sense amplifier circuit, a first back-end-of-line (BEOL) memory array and a second BEOL memory array over the FEOL periphery circuitry; and conducting layers disposed between the FEOL periphery circuitry and the first BEOL memory array or the second BEOL memory array. The conducting layers include: one or more conducting features connecting first bit lines of the first memory array and of the second memory array to the first sense amplifier circuit, and connecting second bit lines of the first memory array and of the second memory array to the second sense amplifier circuit.

In some embodiments, a method is also disclosed that includes forming a first sense amplifier circuit and a second sense amplifier circuit within periphery circuitry over a substrate layer; forming conducting layers over the periphery circuitry; and forming a first memory array and a second memory array over the conducting layers, wherein the conducting layers are disposed between the periphery circuitry and the first memory array or the second memory array, to connect a first bit line pair to the first sense amplifier circuit and to connect a second bit line pair to the second sense amplifier circuit, the second bit line pair being adjacent to the first bit line pair.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory circuit, comprising:
a first memory array having a plurality of bit lines;
a second memory array having a plurality of bit lines;
a first sense amplifier connected to a first bit line of the first memory array and a first bit line of the second memory array; and
a second sense amplifier connected to a second bit line of the first memory array and a second bit line of the second memory array, the second bit line of the first memory array being adjacent to the first bit line of the first memory array, and the second bit line of the second memory array being adjacent to the first bit line of the second memory array, wherein the first bit line of the first memory array is displaced from the first bit line of the second memory array by a half pitch.

2. The memory circuit of claim 1, wherein the first sense amplifier and the second sense amplifier are located within a front-end-of-line (FEOL) structure of the memory circuit.

3. The memory circuit of claim 2, wherein the first memory array and the second memory array are located within a back-end-of-line (BEOL) structure above the front-end-of-line (FEOL) structure.

4. The memory circuit of claim 1, wherein the first bit line of the first memory array has a horizontal offset with respect to the first bit line of the second memory array.

5. The memory circuit of claim 1, wherein the first sense amplifier is located within a first FEOL region under the first memory array, and the second sense amplifier is located within a second front-end-of-line (FEOL) region under the second memory array.

6. The memory circuit of claim 1, wherein the first sense amplifier and the second sense amplifier are located within the same front-end-of-line (FEOL) region under the first memory array or the second memory array.

7. The memory circuit of claim 1, further comprising:
a third sense amplifier connected to a third bit line of the first memory array and a third bit line of the second memory array; and
a fourth sense amplifier connected to a fourth bit line of the first memory array and a fourth bit line of the second memory array;
wherein the first sense amplifier and the second sense amplifier are located within a first front-end-of-line (FEOL) region under the first memory array, and the third sense amplifier and the fourth sense amplifier are located within a second front-end-of-line (FEOL) region under the second memory array.

8. A memory structure, comprising:
a substrate layer;
front-end-of-line (FEOL) periphery circuitry formed in or over the substrate layer, the FEOL periphery circuitry comprising a first sense amplifier circuit and a second sense amplifier circuit;

a first back-end-of-line (BEOL) memory array and a second BEOL memory array over the FEOL periphery circuitry; and a plurality of conducting layers disposed between the FEOL periphery circuitry and the first BEOL memory array or the second BEOL memory array, wherein the plurality of conducting layers comprise:

one or more conducting features connecting first bit lines of the first memory array and of the second memory array to the first sense amplifier circuit, and connecting second bit lines of the first memory array and of the second memory array to the second sense amplifier circuit, wherein the first bit line of the first memory array is displaced from the first bit line of the second memory array by a half pitch.

9. The memory structure of claim 8, wherein the FEOL periphery circuitry comprises:

one or more first transistor structures connected to form the first sense amplifier circuit; and one or more second transistor structures connected to form the second sense amplifier circuit.

10. The memory structure of claim 8, wherein the first bit line of the first memory array has a horizontal offset with respect to the first bit line of the second memory array.

11. The memory structure of claim 8, wherein the first sense amplifier circuit is located within a first region of the FEOL periphery circuitry under the first memory array, and the second sense amplifier circuit is located within a second region of the FEOL periphery circuitry under the second memory array.

12. The memory structure of claim 8, wherein the first sense amplifier circuit and the second sense amplifier circuit are located within the same region of the FEOL periphery circuitry under the first memory array or the second memory array.

13. A method for fabricating a memory device, the method comprising:

forming a first sense amplifier circuit and a second sense amplifier circuit within periphery circuitry over a substrate layer;

forming a plurality of conducting layers over the periphery circuitry by:

forming one or more first conducting features connecting a first bit line of the first memory array to a first input node of the first sense amplifier circuit, one or more second conducting features connecting a first bit line of the second memory array to a second input node of the first sense amplifier circuit, one or more third conducting features connecting a second bit line of the first memory array to a first input node of the second sense amplifier circuit, one or more fourth conducting features connecting a second bit line of the second memory array to a second input node of the second sense amplifier circuit; and forming a first memory array and a second memory array over the plurality of conducting layers, wherein the plurality of conducting layers are disposed between the periphery circuitry and the first memory array or the second memory array, to connect a first bit line pair to the first sense amplifier circuit and to connect a second bit line pair to the second sense amplifier circuit, the second bit line pair being adjacent to the first bit line pair.

14. The method of claim 13, wherein the forming the first memory array and the second memory array comprises:

displacing a plurality of bit lines of the first memory array from a plurality of bit lines of the second memory array by an offset.

15. The method of claim 13, wherein the forming the first memory array and the second memory array comprises:

aligning a plurality of bit lines of the first memory array with respect to a plurality of bit lines of the second memory array.

16. The memory structure of claim 8, wherein the FEOL periphery circuitry further comprises:

a third sense amplifier connected to a third bit line of the first memory array and a third bit line of the second memory array; and a fourth sense amplifier connected to a fourth bit line of the first memory array and a fourth bit line of the second memory array.

17. The memory structure of claim 16, wherein the first sense amplifier and the second sense amplifier are located within a first front-end-of-line (FEOL) region under the first memory array.

18. The memory structure of claim 17, wherein the third sense amplifier and the fourth sense amplifier are located within a second front-end-of-line (FEOL) region under the second memory array.

19. The method of claim 13, wherein the first sense amplifier circuit and the second sense amplifier circuit are formed within a first front-end-of-line (FEOL) region under the first memory array.

20. The method of claim 19, further comprising:

forming a third sense amplifier circuit and a fourth sense amplifier circuit within periphery circuitry over the substrate layer, wherein the third sense amplifier circuit and the fourth sense amplifier circuit are formed within a second front-end-of-line (FEOL) region under the second memory array.

* * * * *